(12) United States Patent
Hsu

(10) Patent No.: US 11,322,453 B2
(45) Date of Patent: May 3, 2022

(54) SEMICONDUCTOR PACKAGE HAVING CHANNELS FORMED BETWEEN THROUGH-INSULATOR-VIAS

(71) Applicant: Taiwan Semiconductor Manufacturing Co., Ltd., Hsinchu (TW)

(72) Inventor: Sen-Kuei Hsu, Kaohsiung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/697,133

(22) Filed: Nov. 26, 2019

(65) Prior Publication Data
US 2021/0159185 A1 May 27, 2021

(51) Int. Cl.
*H01L 23/552* (2006.01)
*H01L 23/538* (2006.01)
(Continued)

(52) U.S. Cl.
CPC .......... *H01L 23/552* (2013.01); *H01L 21/486* (2013.01); *H01L 21/565* (2013.01); *H01L 23/3128* (2013.01); *H01L 23/5383* (2013.01); *H01L 23/5384* (2013.01); *H01L 23/5386* (2013.01); *H01L 23/5389* (2013.01); *H01L 23/66* (2013.01); *H01L 24/20* (2013.01); *H01L 21/4857* (2013.01); *H01L 21/6835* (2013.01); *H01L 23/293* (2013.01); *H01L 23/49816* (2013.01); *H01L 24/19* (2013.01);
(Continued)

(58) Field of Classification Search
CPC . H01L 21/4857; H01L 21/486; H01L 21/565; H01L 21/6835; H01L 23/293; H01L 23/3128; H01L 23/49816; H01L 23/5383; H01L 23/5384; H01L 23/5386; H01L 23/5389; H01L 23/552; H01L 23/66; H01L 24/18; H01L 24/19; H01L 24/20; H01L 2221/68345; H01L 2221/68359; H01L 2223/6677; H01L 2224/214; H01L 2224/73267; H01L 2224/92244; H01L 2924/3025
See application file for complete search history.

(56) References Cited

U.S. PATENT DOCUMENTS 9,000,584 B2 4/2015 Lin et al.
9,048,222 B2 6/2015 Hung et al.
(Continued)

*Primary Examiner* — Eduardo A Rodela
*Assistant Examiner* — Christopher M Roland
(74) *Attorney, Agent, or Firm* — JCIPRNET

(57) ABSTRACT

A semiconductor package includes a die, through insulator vias, an encapsulant, and a pair of metallization layers. The through insulator vias are disposed beside the die. The encapsulant wraps the die and the through insulator vias. The pair of metallization layers is disposed on opposite sides of the encapsulant. One end of each through insulator via contacts one of the metallization layers and the other end of each through insulator via contacts the other metallization layer. The through insulator vias form at least one photonic crystal structure. A pair of the through insulator vias is separated along a first direction by a channel filled by the encapsulant. A width of the channel along the first direction is larger than a pitch of the photonic crystal structure along the first direction.

20 Claims, 21 Drawing Sheets

(51) Int. Cl.
  *H01L 23/31*     (2006.01)
  *H01L 23/66*     (2006.01)
  *H01L 23/00*     (2006.01)
  *H01L 21/56*     (2006.01)
  *H01L 21/48*     (2006.01)
  *H01L 23/29*     (2006.01)
  *H01L 23/498*    (2006.01)
  *H01L 21/683*    (2006.01)

(52) U.S. Cl.
  CPC ............ *H01L 2221/68345* (2013.01); *H01L 2221/68359* (2013.01); *H01L 2223/6677* (2013.01); *H01L 2224/214* (2013.01); *H01L 2224/73267* (2013.01); *H01L 2224/92244* (2013.01); *H01L 2924/3025* (2013.01)

(56) References Cited

U.S. PATENT DOCUMENTS

| | | |
|---|---|---|
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2013/0105989 A1* | 5/2013 | Pagaila ............... H01L 25/0655 257/774 |
| 2018/0366439 A1* | 12/2018 | Lin .................... H01L 24/17 |
| 2019/0164895 A1* | 5/2019 | Kim .................. H01L 23/3121 |
| 2021/0090993 A1* | 3/2021 | Yu ...................... H01L 23/5226 |

* cited by examiner (II-II)

(I-I)

SEMICONDUCTOR PACKAGE HAVING CHANNELS FORMED BETWEEN THROUGH-INSULATOR-VIAS

BACKGROUND

Semiconductor devices and integrated circuits used in a variety of electronic apparatus, such as cell phones and other mobile electronic equipment, are typically manufactured on a single semiconductor wafer. The dies of the wafer may be processed and packaged with other semiconductor devices or dies at the wafer level, and various technologies and applications have been developed for wafer level packaging. Integration of multiple semiconductor devices has become a challenge in the field. To respond to the increasing demand for miniaturization, higher speed and better electrical performance (e.g., lower transmission loss and insertion loss), more creative packaging and assembling techniques are actively researched.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
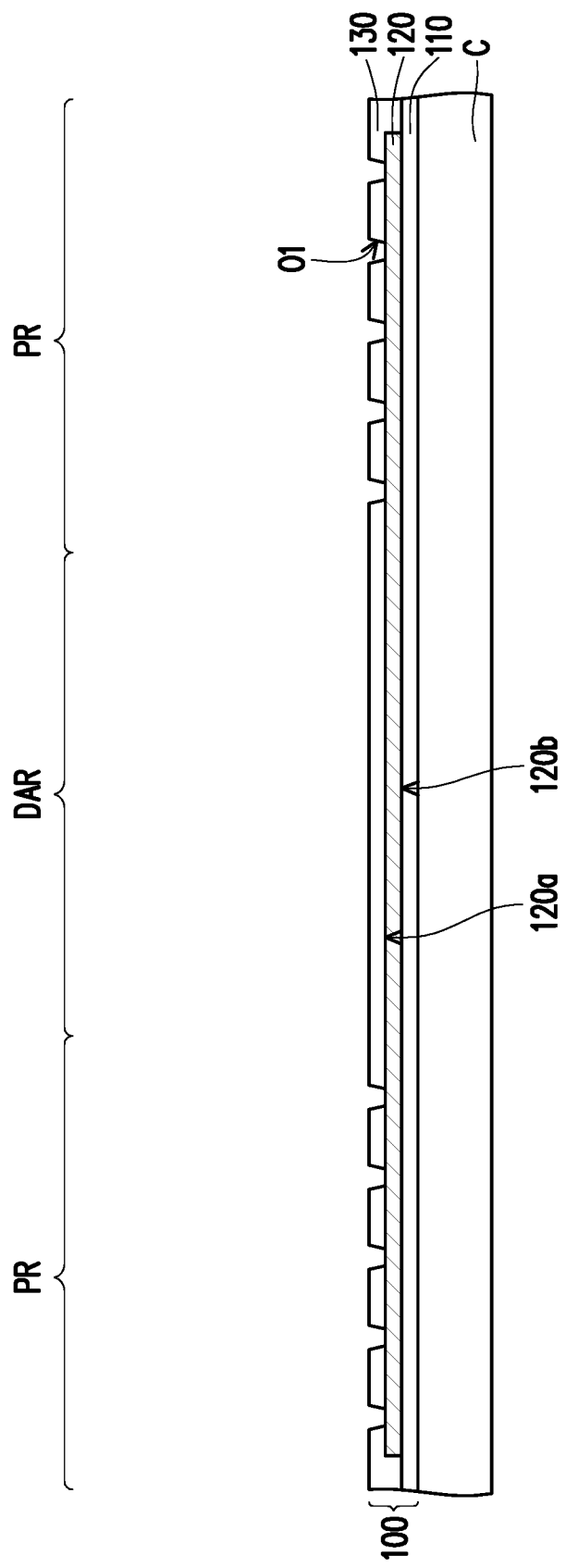
FIG. 1A to FIG. 1G are schematic cross-sectional views illustrating a manufacturing process of a semiconductor package in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1G are schematic cross-sectional views illustrating structures produced during a manufacturing process of a semiconductor package 10 (shown in FIG. 1G) in accordance with some embodiments of the disclosure. Referring to FIG. 1A, a carrier C is provided. In some embodiments, the carrier C is a glass substrate, a metal plate, a plastic supporting board or the like, but other suitable substrate materials may be used as long as the materials are able to withstand the subsequent steps of the process. In some embodiments, a de-bonding layer (not shown) may be formed over the carrier C. In some embodiments, the de-bonding layer includes a light-to-heat conversion (LTHC) release layer, which facilitates peeling the carrier C away from the semiconductor device when required by the manufacturing process.

In some embodiments, an interconnection structure 100 is formed over the carrier C. In some embodiments, the interconnection structure 100 is formed on the de-bonding layer (not shown). In some embodiments, the interconnection structure 100 includes an outer dielectric layer 110, a metallization layer 120, and an inner dielectric layer 130. In some embodiments, the outer dielectric layer 110 is formed over the carrier C, and the metallization layer 120 and the inner dielectric layer 130 are sequentially provided on the outer dielectric layer 110. The metallization layer 120 may be disposed between the outer dielectric layer 110 and the inner dielectric layer 130. In some embodiments, the metallization layer 120 is a conductive metal plate sandwiched between the two dielectric layers 110 and 130. In some embodiments, the inner dielectric layer 130 may be patterned to include openings O1 exposing portions of the metallization layer 120. In some embodiments, the inner dielectric layer 130 may include a die attach region DAR without openings, and a peripheral region PR beside the die attach region DAR in which the openings O1 are formed. In some embodiments, the die attach region DAR extends towards a central portion of the inner dielectric layer, and is surrounded by the peripheral region PR. In some embodiments, the peripheral region PR may have an annular shape encircling the die attach region DAR. In some embodiments, portions of a first surface 120a of the backside metallization layer 120 are exposed by the inner dielectric layer. A second surface 120b opposite to the first surface 120a may be covered by the outer dielectric layer 110. In some embodiments, a material of the metallization layer 120 includes copper, aluminum or the like. In some embodiments, the material of the metallization layer 120 includes copper. Throughout the description, the term "copper" is intended to include substantially pure elemental copper, copper containing unavoidable impurities, and copper alloys containing elements such as tantalum, indium, tin, zinc, manganese, chromium, titanium, germanium, strontium, platinum, magnesium, aluminum or zirconium, etc. The metallization layer 120 may be formed by, for example, electroplating, deposition, and/or photolithography and etching. In some embodiments, the metallization layer 120 may be a pre-formed metal plate placed on the outer dielectric layer 110. In some embodiments, a material of the dielectric layers 110, 130 includes polyimide, epoxy resin, acrylic resin, phenol resin, benzocyclobutene (BCB), polybenzooxazole (PBO), combinations thereof, or any other suitable polymer-based dielectric material. The dielectric layers 110 and 130, for example, may be formed by suitable fabrication techniques such as spin-on coating, chemical vapor deposition (CVD), plasma-enhanced chemical vapor deposition (PECVD), or the like. In some alternative embodiments, more metallization layers 120 and more dielectric layers 110, 130 than the ones illustrated in FIG. 1A may be formed depending on production requirements. In some embodiments, the interconnection structure 100 is referred to as a backside redistribution structure.

Figure 1B:
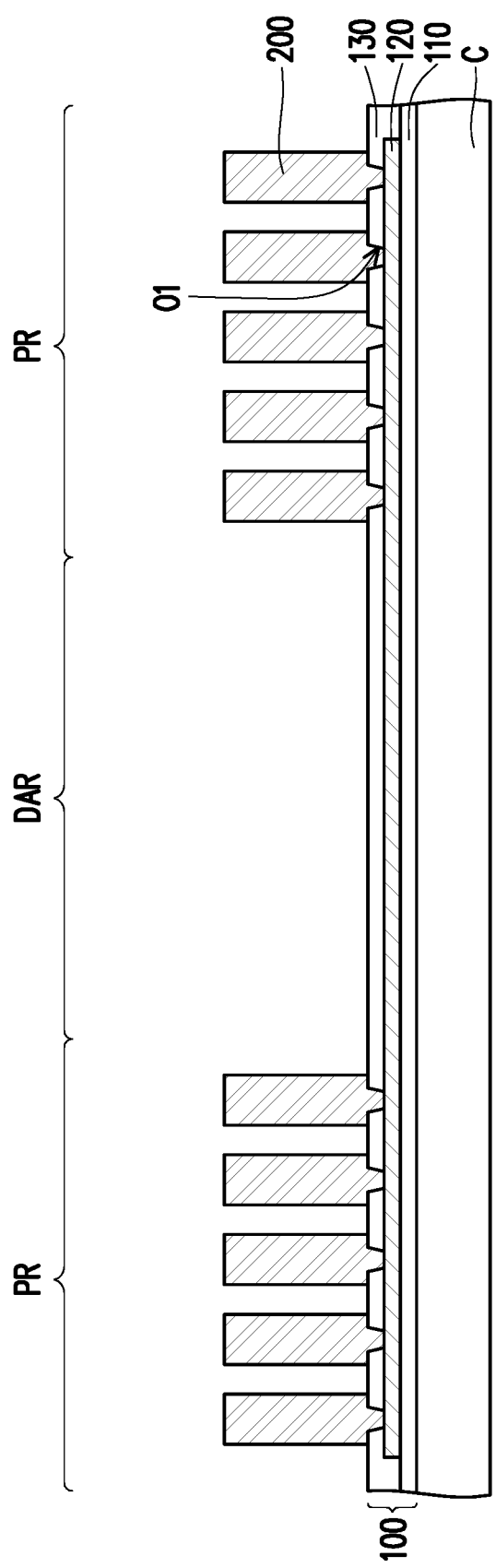

Referring to FIG. 1B, a plurality of through insulator vias (TIVs) 200 are formed on the backside interconnection structure 100. In some embodiments, the TIVs 200 are formed in the peripheral region PR in correspondence of the openings O1. For example, the TIVs 200 are plated on the exposed portions of the metallization layer 120. In some embodiments, the TIVs 200 may be formed as described below. First, a seed material layer (not shown) is formed over the inner dielectric layer 130. In some embodiments, the seed material layer includes a titanium/copper composite layer and is formed by a sputtering process to conformally cover the inner dielectric layer 130. The seed material layer may extend within the openings O1 to contact the exposed portions of the metallization layer 120. Thereafter, a patterned auxiliary mask (not shown) with openings is formed on the seed material layer. The openings of the auxiliary mask expose the intended locations for the subsequently formed TIVs 200. For example, the openings of the auxiliary mask are formed in correspondence of the locations of the openings O1. Afterwards, a plating process is performed to form a metal material layer (e.g., a copper layer) on the seed material layer exposed by the openings of the auxiliary mask. Subsequently, the auxiliary mask and the seed material layer not covered by the metal material layer are removed, for example via a stripping process and an etching process, to form the TIVs 200. However, the disclosure is not limited thereto. In some alternative embodiments, other suitable methods may be utilized to form the TIVs 200. For example, pre-fabricated TIVs 200 (e.g., pre-fabricated copper pillars) may be picked-and-placed onto the backside interconnection structure 100. In some embodiments, TIVs 200 are formed to have substantially the same shape and are regularly spaced along at least two directions to form at least three rows for each direction.

Figure 1C:
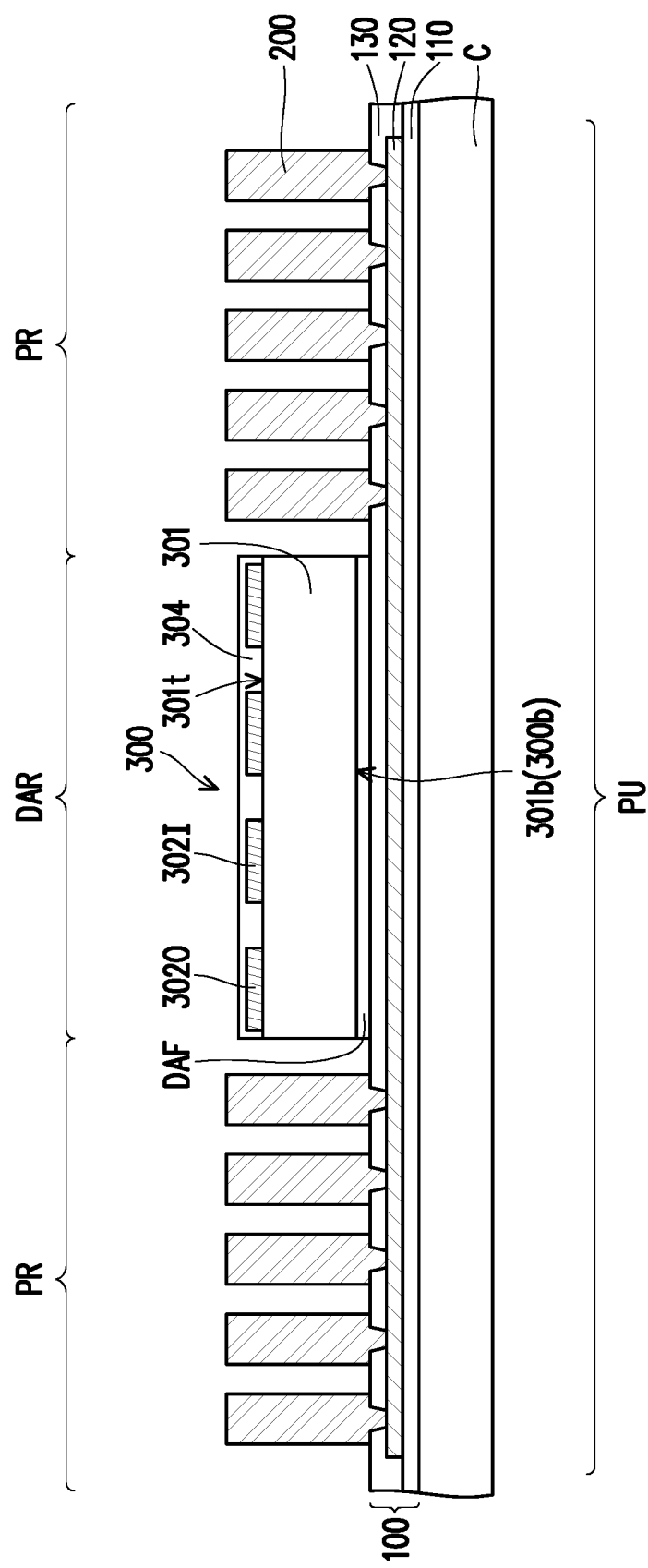

In some embodiments, referring to FIG. 1C, semiconductor dies 300 are provided on the carrier C. In some embodiments, the semiconductor dies 300 are placed onto the carrier C through a pick-and-place method. Even though only one semiconductor die 300 is presented in FIG. 1C for illustrative purposes, a plurality of semiconductor dies may be provided on the carrier C to produce multiple package units PU with wafer-level packaging technology. In some embodiments, an individual semiconductor die 300 includes a semiconductor substrate 301, contact pads 302O, 302I and a passivation layer 304. The contact pads 302O, 302I may be formed on a top surface 301t of the semiconductor substrate 301. The passivation layer 304 may cover the top surface 301t and the contact pads 302I, 302O. In some alternative embodiments, the passivation layer 304 may expose at least a portion of each contact pad 302I, 302O. In some embodiments, the semiconductor die 300 may further include conductive posts (not shown) electrically connected to the contact pads 302I, 302O, and a protective layer (not shown) surrounding the conductive posts.

In some embodiments, the semiconductor dies 300 are placed on the backside interconnection structure 100 in the die attach region DAR with the top surface 301t of the substrate 301 facing away from the carrier C. A backside surface 300b of the semiconductor dies 300 may coincide with the bottom surface 301b of the semiconductor substrate 301. In some embodiments, the semiconductor dies 300 are disposed with the bottom surfaces 301b facing the backside interconnection structure 100. Portions of die attach film DAF may be disposed on the bottom surfaces 301b, to secure the semiconductor dies 300 to the inner dielectric layer 130. In some embodiments, the die attach film DAF includes a pressure adhesive, a thermally curable adhesive, or the like.

In some embodiments, the semiconductor substrate 301 may be made of semiconductor materials, such as semiconductor materials of the groups III-V of the periodic table. In some embodiments, the semiconductor substrate 301 includes elemental semiconductor materials, such as crystalline silicon, diamond, or germanium; compound semiconductor materials such as silicon carbide, gallium arsenic, indium arsenide, or indium phosphide, or alloy semiconductor materials such as silicon germanium, silicon germanium carbide, gallium arsenic phosphide, or gallium indium phosphide. In some embodiments, the semiconductor substrate 301 includes active components (e.g., transistors or the like) and optionally passive components (e.g., resistors, capacitors, inductors, or the like) formed therein.

In certain embodiments, the contact pads 302O, 302I include aluminum pads, copper pads, or other suitable metal pads. In some embodiments, the passivation layer 304 may be a single layer or a multi-layered structure, including a silicon oxide layer, a silicon nitride layer, a silicon oxynitride layer, a dielectric layer formed by other suitable dielectric materials, or combinations thereof.

Referring to FIG. 1C, the semiconductor die 300 included in a package unit PU may be or include a logic die, such as a central processing unit (CPU) die, a graphic processing unit (GPU) die, a micro control unit (MCU) die, an input-output (I/O) die, a baseband (BB) die, a field-programmable gate array (FPGA) die, an application processor (AP) die, or the like. In some embodiments, the semiconductor die 300 is or includes at least one wireless or radio-frequency chip.

Figure 1D:
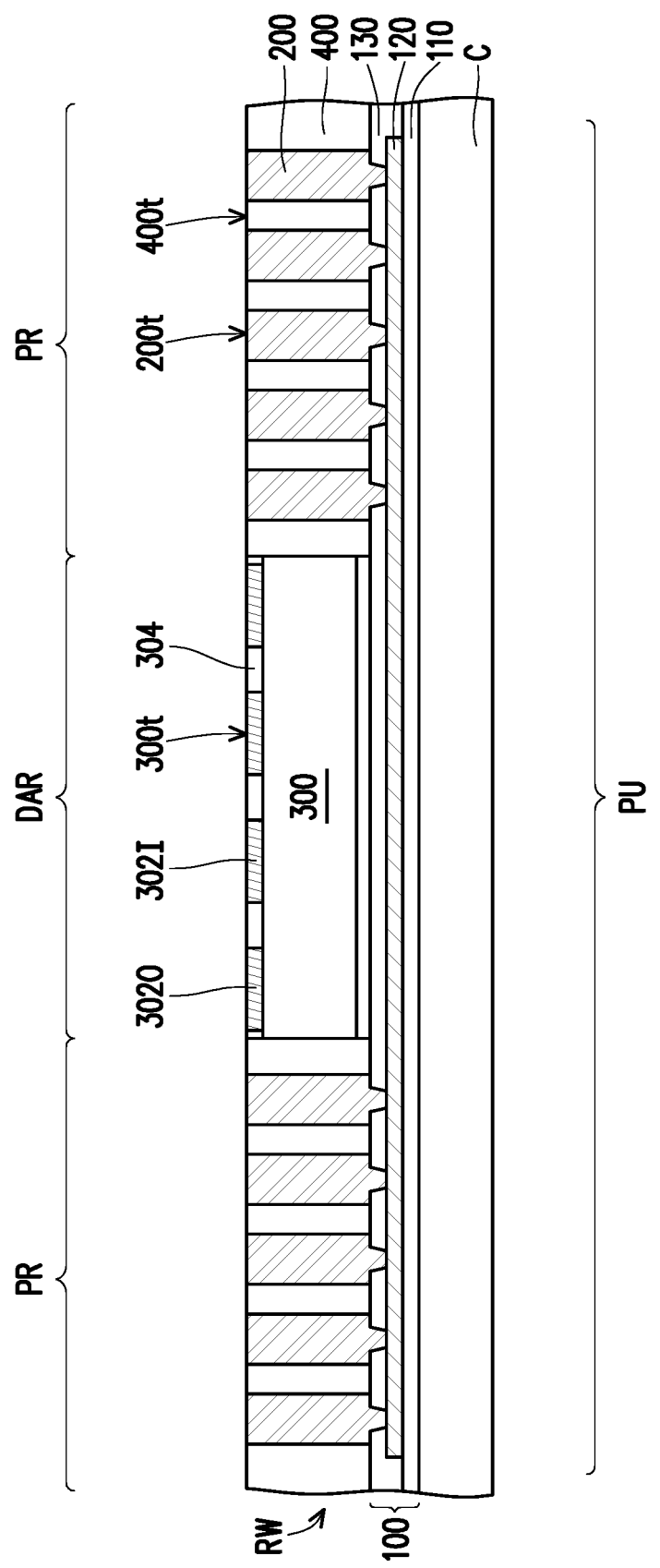

Referring to FIG. 1D, an encapsulant 400 is formed over the backside interconnection structure 100 to encapsulate the TIVs 200 and the semiconductor die 300. In some embodiments, a material of the encapsulant 400 includes a molding compound, a polymeric material, such as polyimide, epoxy resin, acrylic resin, phenol resin, benzocyclobutene (BCB), polybenzoxazole (PBO), a combination thereof, or other suitable polymer-based dielectric materials. In some embodiments, a dielectric constant of the material of the encapsulant 400 may be in the range from 50 to 150. The encapsulant 400 may be formed by a sequence of overmolding and planarization steps. For example, the encapsulant 400 may be originally formed by a molding process (such as a compression molding process) or a spin-coating process to completely cover the semiconductor die 300 and the TIVs 200. In some embodiments, the planarization of the encapsulant 400 includes performing a mechanical grinding process and/or a chemical mechanical polishing (CMP) process. In some embodiments, the planarization process is performed until the conductive pads 302I, 302O of the semiconductor die 300 are exposed. In some embodiments, portions of the passivation layer 304 and the TIVs 200 may also be removed during the planarization process of the encapsulant 400. In some embodiments, following the planarization process, the active surface 300t of the semiconductor die 300 (the surface exposing the conductive pads 302O, 302I or the conductive posts if included), the top surfaces 200t of the TIVs and the top surface 400t of the encapsulant 400 may be substantially at a same level height (be substantially coplanar). As illustrated in FIG. 1D, the encapsulant 400 laterally encapsulates the semiconductor die 300 and the TIVs 200. With the formation of the encapsulant 400, a reconstructed wafer RW is obtained. In some embodiments, the reconstructed wafer RW includes a plurality of package units PU. In other words, the exemplary process may be performed at a reconstructed wafer level, so that multiple package units PU are processed in the form of the reconstructed wafer RW. In the cross-sectional view of FIG. 1D, a single package unit PU is shown for simplicity but, of course, this is for illustrative purposes only, and the disclosure is not limited by the number of package units PU being produced in the reconstructed wafer RW.

Figure 1E:
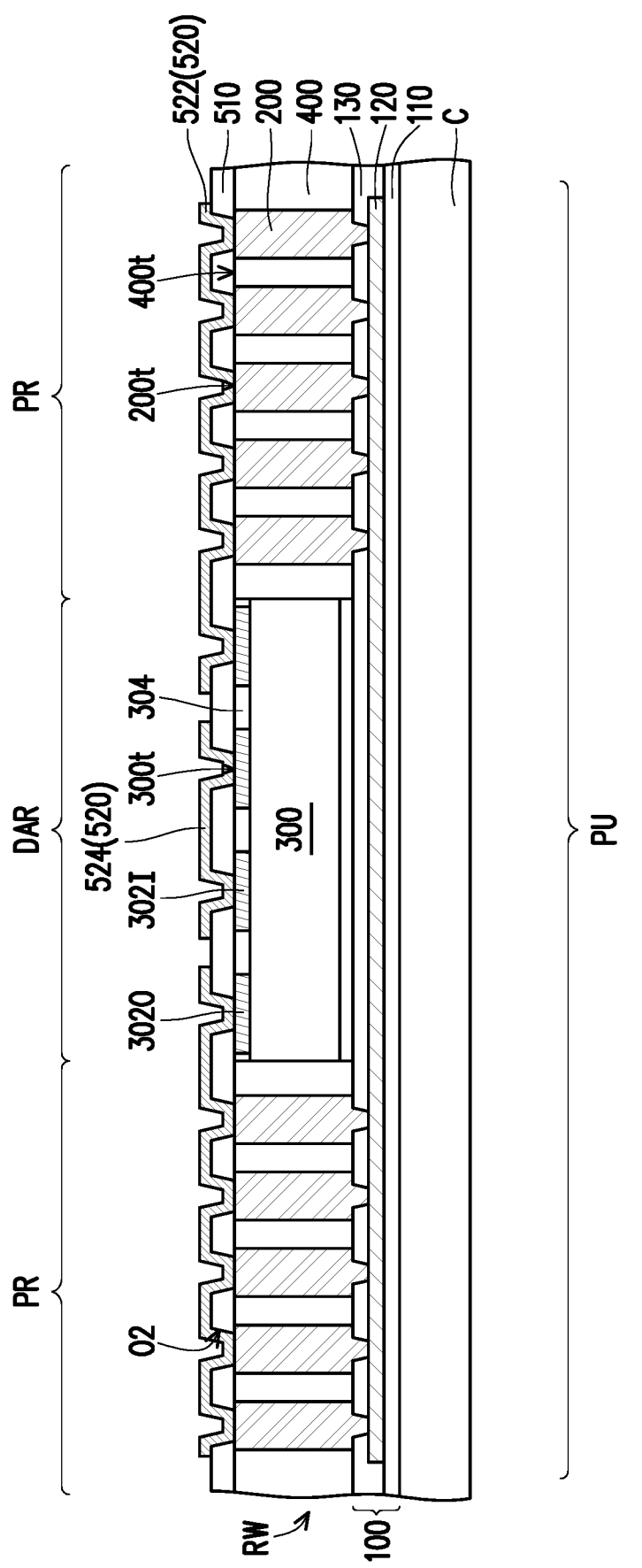

In some embodiments, referring to FIG. 1E, a first dielectric layer 510 and a first metallization layer 520 are stacked over the TIVs 200, the semiconductor dies 300 and the encapsulant 400. The first dielectric layer 510 includes openings O2 exposing the top surfaces 200t of each TIV 200 and the contact pads 302O and 302I. In some embodiments, one of the openings O2 exposes the top surface 200t of an individual TIV 200 or one of the contact pads 302O or 302I. The first metallization layer 520 may be conformally disposed over the first dielectric layer 510, extending within the openings O2 to establish electrical contact with the TIVs 200 and the contact pads 302O and 302I. In some embodiments, narrower openings O2 may be filled by the first metallization layer 520, while wider openings O2 may be lined, rather than filled, by the first metallization layer 520. The first metallization layer 520 may include a peripheral pattern 522 and a die interconnect pattern 524. In some embodiments, the peripheral pattern 522 extends within the openings O2 exposing the TIVs 200 and the outer contact pads 302O, while the die interconnect pattern 524 extends within the openings O2 exposing the inner contact pads 302I. That is, the peripheral pattern 522 extends within the peripheral region PR and further penetrates within the die attach region DAR. In some embodiments, the peripheral pattern 522 may have an annular shape surrounding the die interconnect pattern 524. In some embodiments, a material of the first dielectric layer 510 includes polyimide, epoxy resin, acrylic resin, phenol resin, benzocyclobutene (BCB), polybenzoxazole (PBO), combinations thereof, or any other suitable polymer-based dielectric material. In some embodiments, a material of the first metallization layer 520 includes copper, aluminum or the like. In some embodiments, the material of the first metallization layer 520 includes copper. The first dielectric layer 510 may be formed by suitable fabrication techniques such as spin-on coating, chemical vapor deposition (CVD), plasma-enhanced chemical vapor deposition (PECVD), or the like. In some embodiments, a precursor dielectric layer (not shown) is blanketly formed over the TIVs 200, the semiconductor dies 300 and the encapsulant 400. A patterning step may then be performed to form the openings O2. For example, a patterned auxiliary mask (not shown) may be produced over the blanket precursor dielectric layer. The auxiliary mask may include openings revealing the portions of the precursor dielectric layer that have to be removed to form the openings O2 during a subsequent etching step. In some embodiments, the auxiliary mask may be formed by a sequence of deposition, lithography and etching. In some embodiments, the auxiliary mask includes a positive photoresist or a negative photoresist. The auxiliary mask may then be removed, for example via ashing or stripping. A seed material layer (not shown) may be provided over the first dielectric layer 510, and a second auxiliary mask (not shown) may be provided thereon. The second auxiliary mask may include openings exposing the regions of the seed material layer where the peripheral pattern 522 and the die interconnect pattern 524 are subsequently formed. A conductive material may be formed on the exposed portions of the seed material layer, for example by a plating process. The plating process is, for example, electro-plating, electroless-plating, immersion plating, or the like. The second auxiliary mask and the underlying portions of seed material layer may then be removed to produce the first metallization layer 520.

Figure 1F:
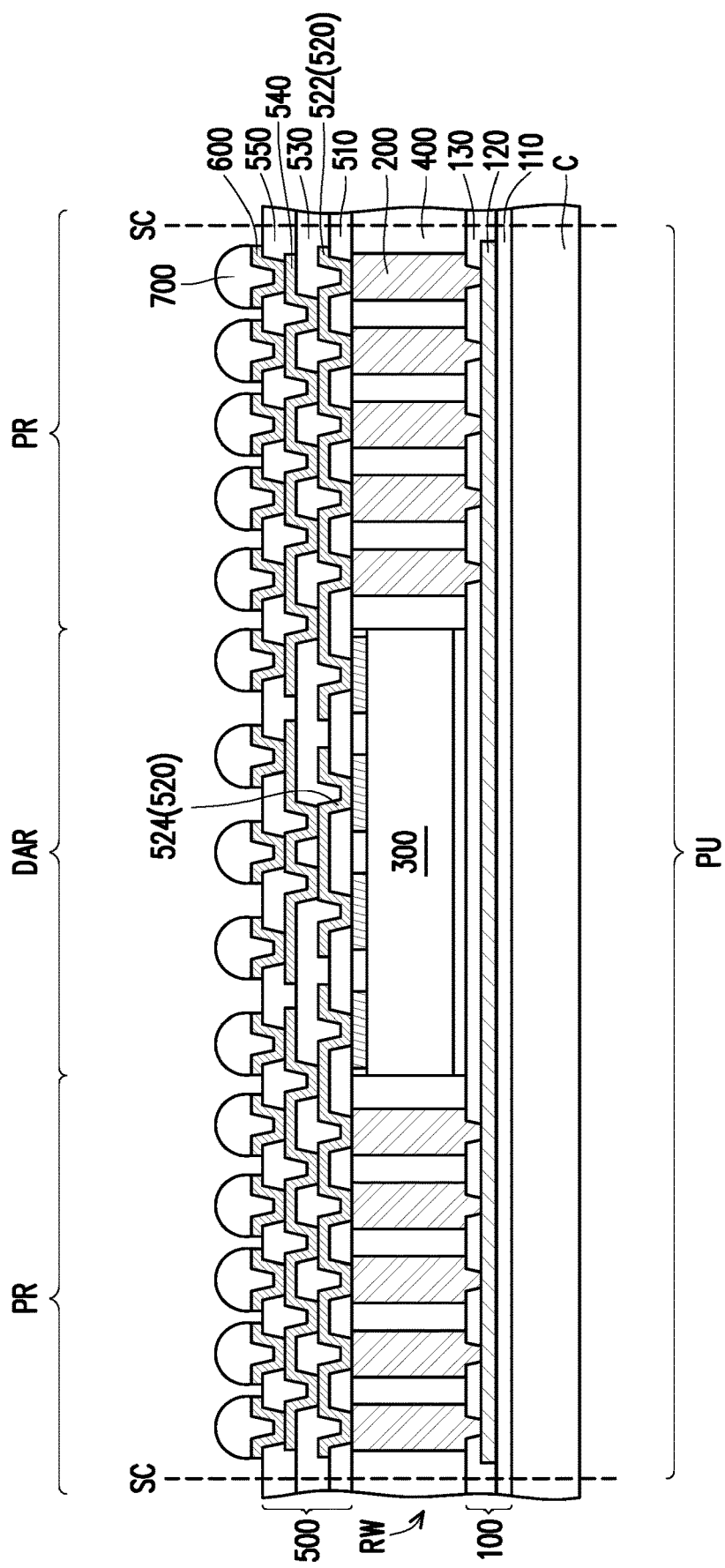

Referring to FIG. 1F, upper layers 530, 540, 550 of a redistribution structure 500 are formed over the first dielectric layer 510 and the first metallization layer 520. In some embodiments, the redistribution structure 500 includes stacked dielectric layers 510, 530, 550 and metallization layers 520, 540 disposed between the stacked dielectric layers 510, 530, 550. The second dielectric layer 530 is disposed on the first metallization layer 520 and the first dielectric layer 510, and includes openings exposing portions of the peripheral pattern 522 and the die interconnect pattern 524. The second metallization layer 540 is disposed on the second dielectric layer 530, and enters the openings of the second dielectric layer 530 to establish electrical contact with the first metallization layer 520. The third dielectric layer 550 is disposed on the second metallization layer 540 and the second dielectric layer 530, and includes openings exposing portions of the second metallization layer 540. In some embodiments, the first dielectric layer 510 is referred to as a bottommost (innermost) dielectric layer 510, and the dielectric layer 550 is referred to as a topmost (outermost) dielectric layer 550. A similar nomenclature may be used for the metallization layers 520, 540. In some embodiments, materials and fabrication methods of the upper layers 530, 540, 550 of the redistribution structure 500 may be similar to what previously described for the first dielectric layer 510 and the first metallization layer 520, and a detailed description thereof is omitted for the sake of brevity. In some embodiments, the redistribution structure 500 is referred to as a frontside redistribution structure. In FIG. 1F the redistribution structure 500 is shown to include three dielectric layers 510, 530, 550 and two metallization layers 520, 540 for illustrative purpose only, without limiting the disclosure. In some embodiments, more or fewer dielectric layers or metallization layers may be included. In some embodiments, the number of metallization layers and the number of dielectric layers can be varied based on the circuit design.

In some embodiments, under-bump metallurgies 600 may be conformally formed in the openings of the outermost dielectric layer 550 exposing the second metallization pattern 540. In some embodiments, the under-bump metallurgies 600 may further extend over portions of the outermost dielectric layer 550. In some embodiments, connectors 700 are formed over the under-bump metallurgies 600. The connectors 700 may include solder balls, ball grid array (BGA) connectors, metal pillars, controlled collapse chip connection (C4) bumps, micro bumps, bumps formed via electroless nickel-electroless palladium-immersion gold technique (ENEPIG), a combination thereof (e.g., a metal pillar with a solder ball attached), or the like. The first metallization layer 520 and the second metallization layer 540 establish electrical connection between the semiconductor die 300 and a first portion of the connectors 700 with the underlying under-bump metallurgies 600 and between the TIVs 200 and a second portion of the connectors 700 with the underlying under-bump metallurgies 600.

Figure 1G:
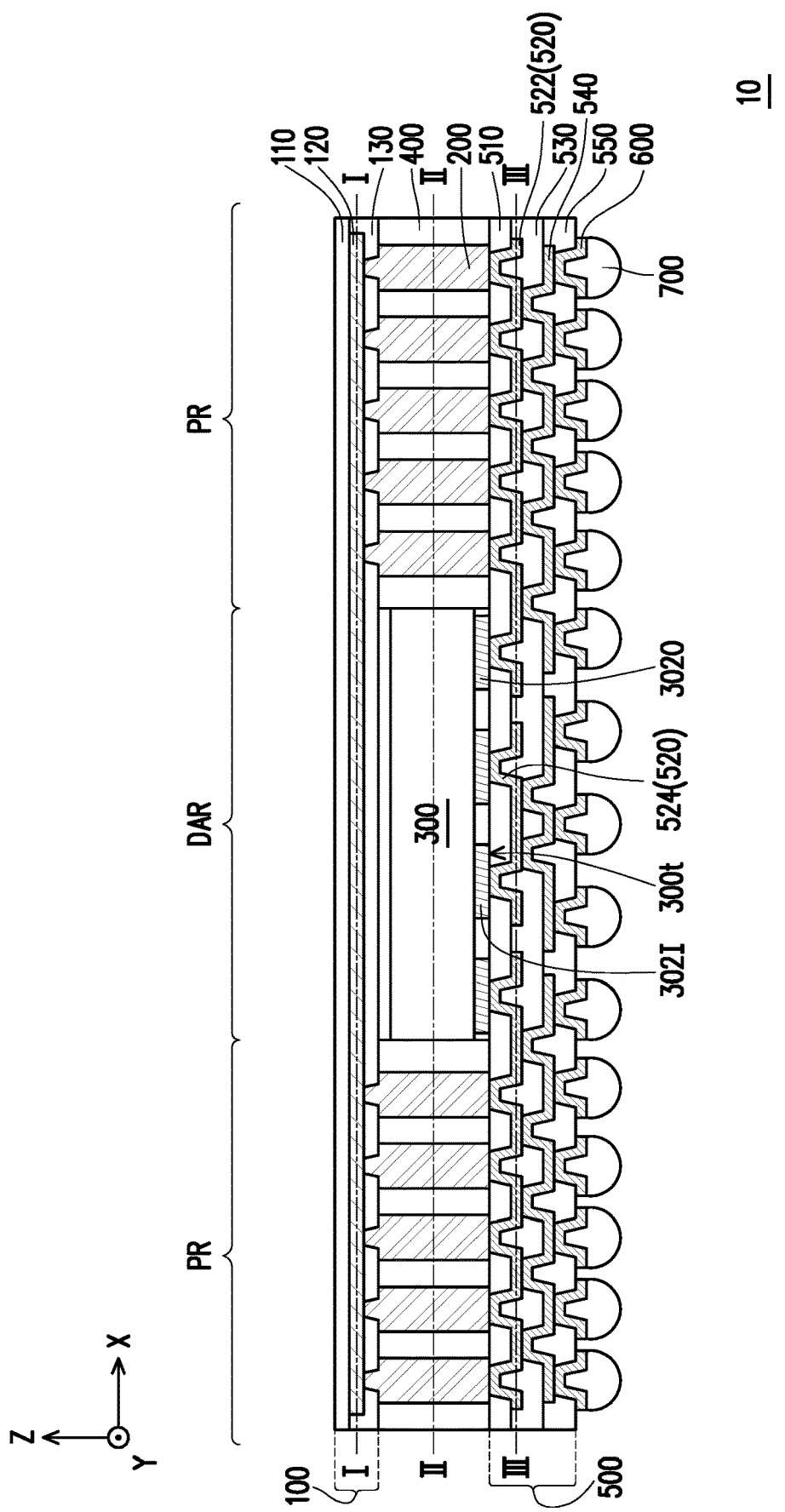

In some embodiments, referring to FIG. 1F and FIG. 1G, a singulation step is performed to separate the individual semiconductor packages 10, for example, by cutting through the reconstructed wafer RW along the scribe lanes SC arranged between individual package units PU. In some embodiments, adjacent semiconductor packages 10 may be separated by cutting through the scribe lanes SC of the reconstructed wafer RW. In some embodiments, the singulation process typically involves performing a wafer dicing process with a rotating blade and/or a laser beam. In some embodiments, the carrier C is separated from the semiconductor packages 10 following singulation. If the de-bonding layer (e.g., the LTHC release layer) is included, the de-bonding layer may be irradiated with a UV laser so that the carrier C and the de-bonding layer are easily peeled off from the semiconductor packages 10. Nevertheless, the de-bonding process is not limited thereto, and other suitable de-bonding methods may be used in some alternative embodiments.

After the singulation step and removal of the carrier C, a plurality of semiconductor packages 10 are obtained. An exemplary cross-sectional view of the semiconductor package 10 according to some embodiments of the disclosure is illustrated in FIG. 1G. Based on the above, a semiconductor package 10 includes TIVs 200 and a semiconductor die 300 surrounded by the encapsulant 400 and electrically connected to a frontside redistribution structure 500 and a backside interconnection structure 100. In some embodiments, the semiconductor package 10 has a die attach region DAR and a peripheral region PR. The TIVs 200 are disposed in the peripheral region PR, and are interconnected to each other by the backside metallization layer 120 and the peripheral pattern 522 of the first frontside metallization layer 520. The frontside redistribution layer 500 establishes electrical connection with the connectors 700 and the underlying under-bump metallurgies 600.

Figure 1H:
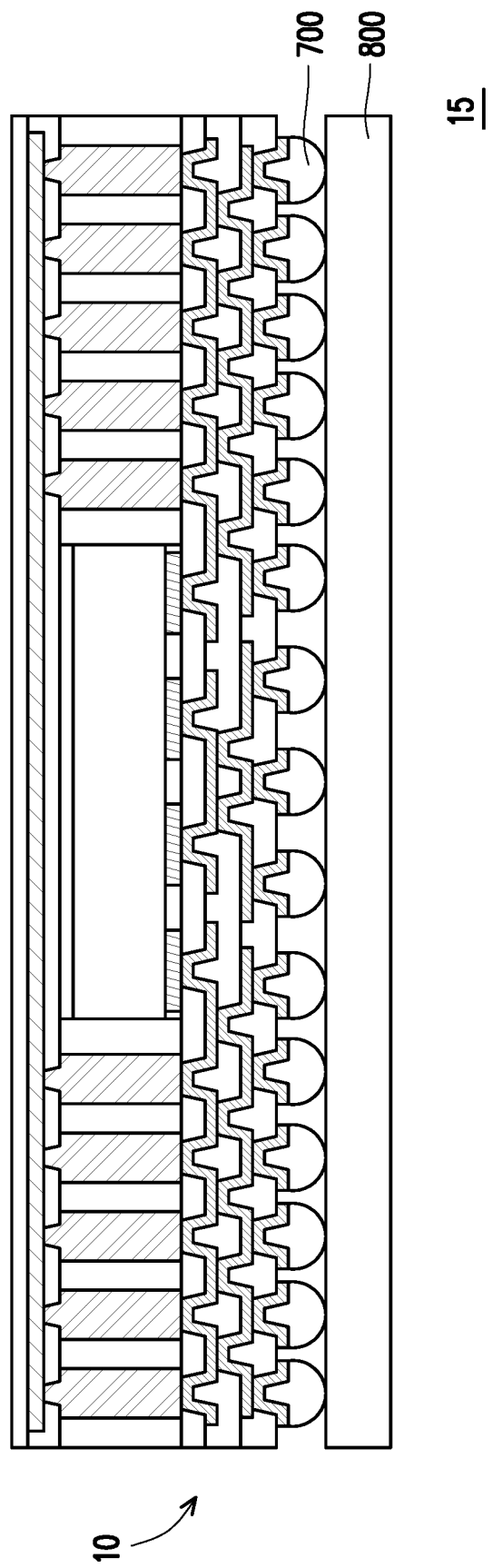
FIG. 1H is a schematic cross-sectional view illustrating an electronic device in accordance with some embodiments of the disclosure.

FIG. 1H is a schematic cross-sectional view illustrating an electronic device 15 in accordance with some embodiments of the disclosure. In some embodiments, the electronic device 15 includes the semiconductor package 10 connected to a circuit substrate 800. In some embodiments, the circuit substrate 800 may be a semiconductor interposer, a mother board, a printed circuit board, or the like. The semiconductor package 10 may be connected to the circuit substrate 800 via the connectors 700.

Figure 2A:
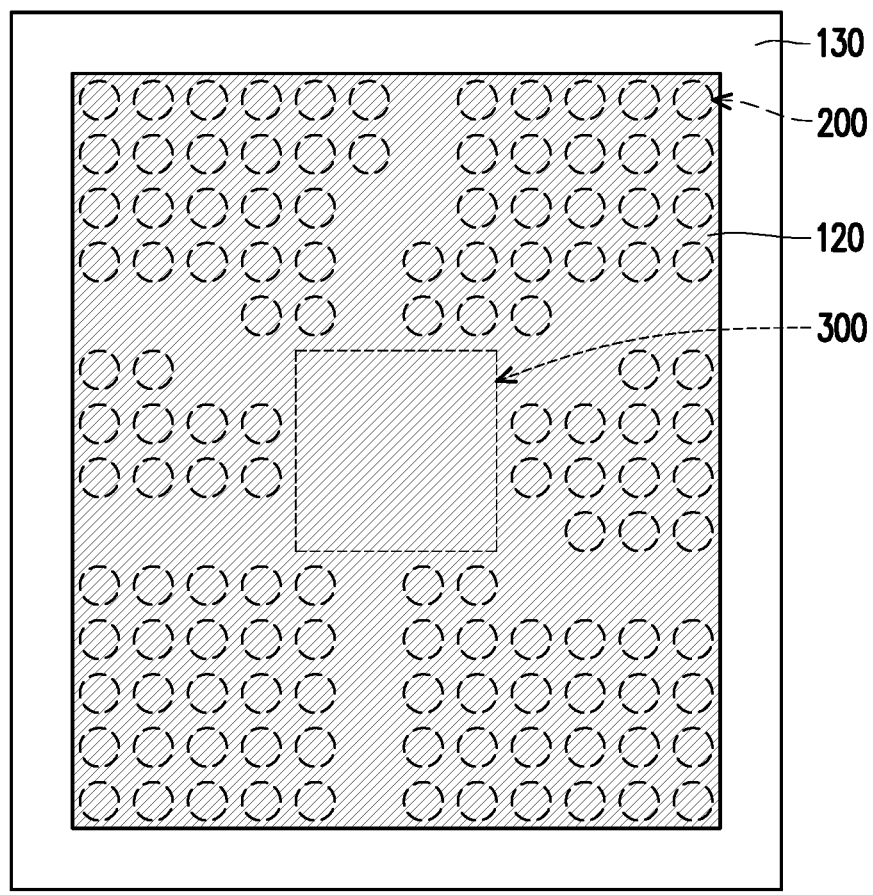
FIG. 2A to FIG. 2C are cross-sectional views of a semiconductor package in accordance with some embodiments of the disclosure.
Figure 2B:
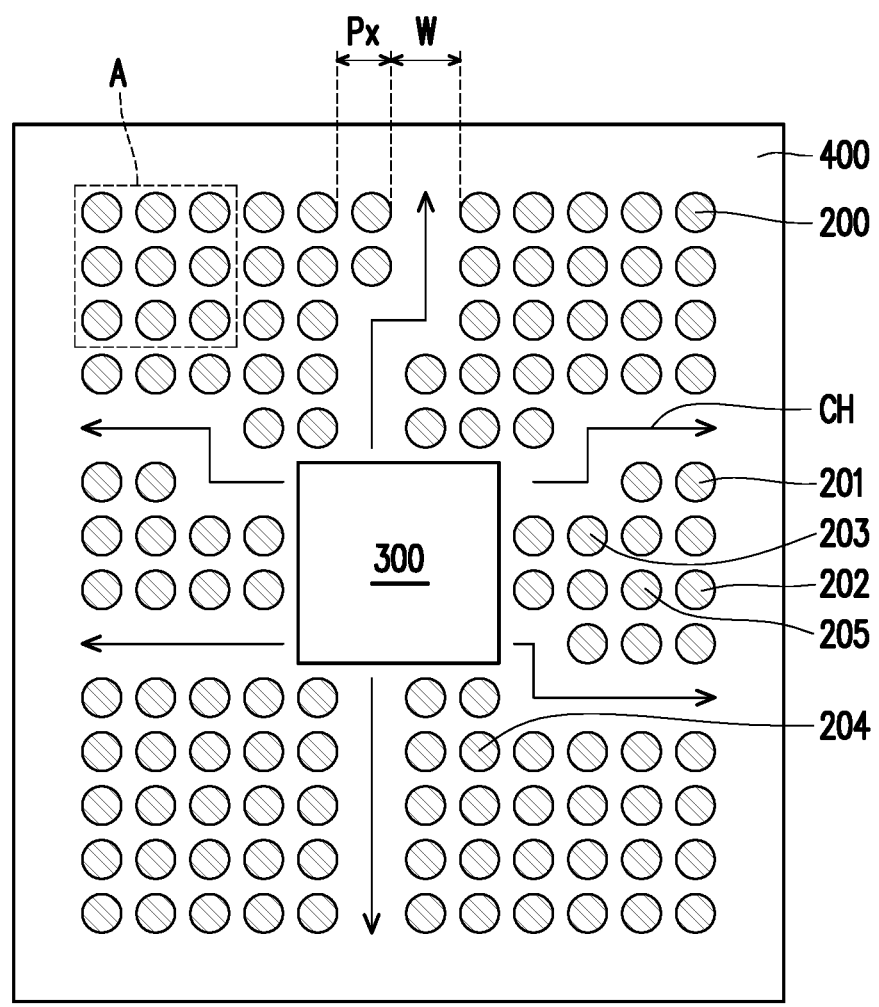
Figure 2C:
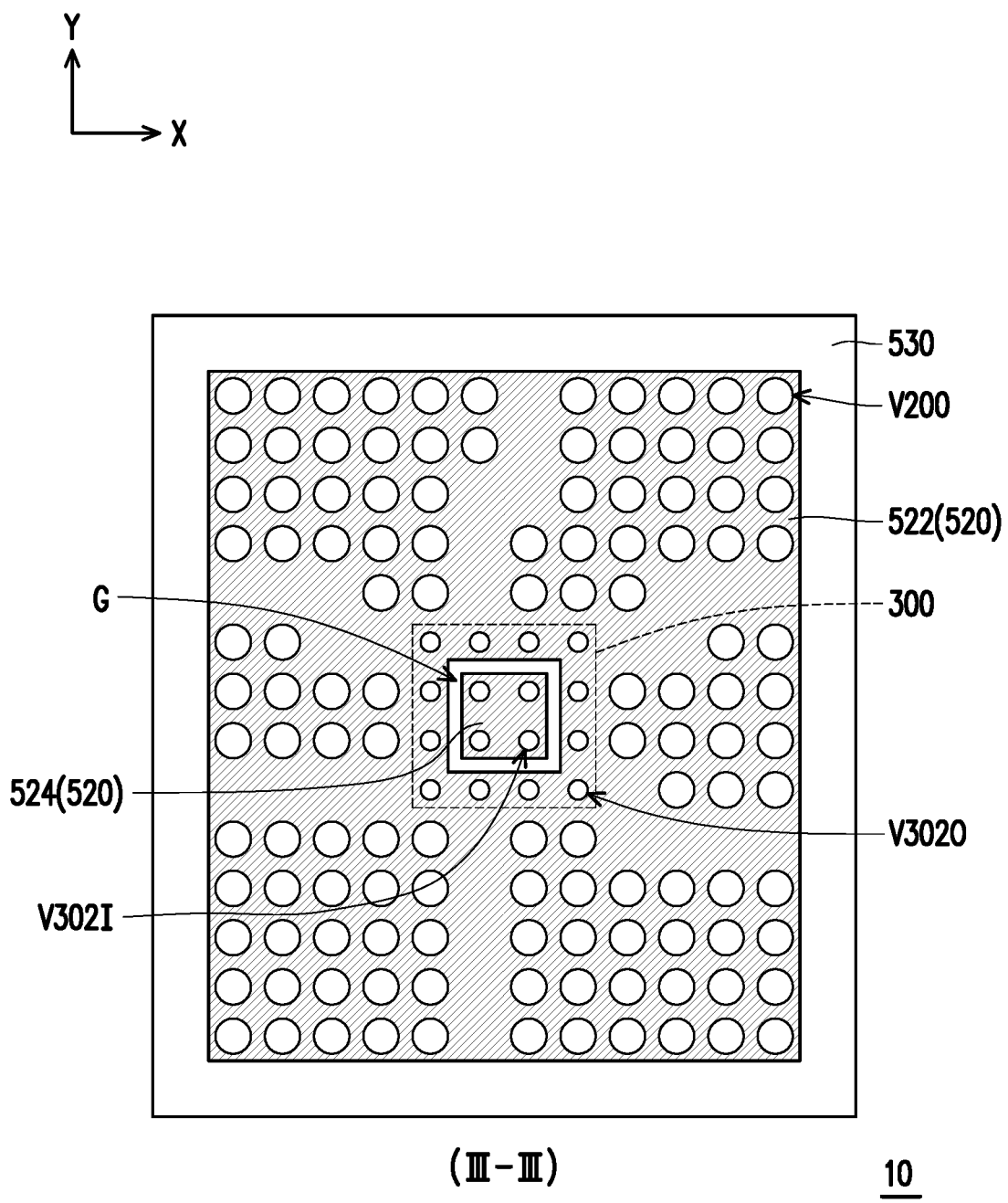
Figure 2D:
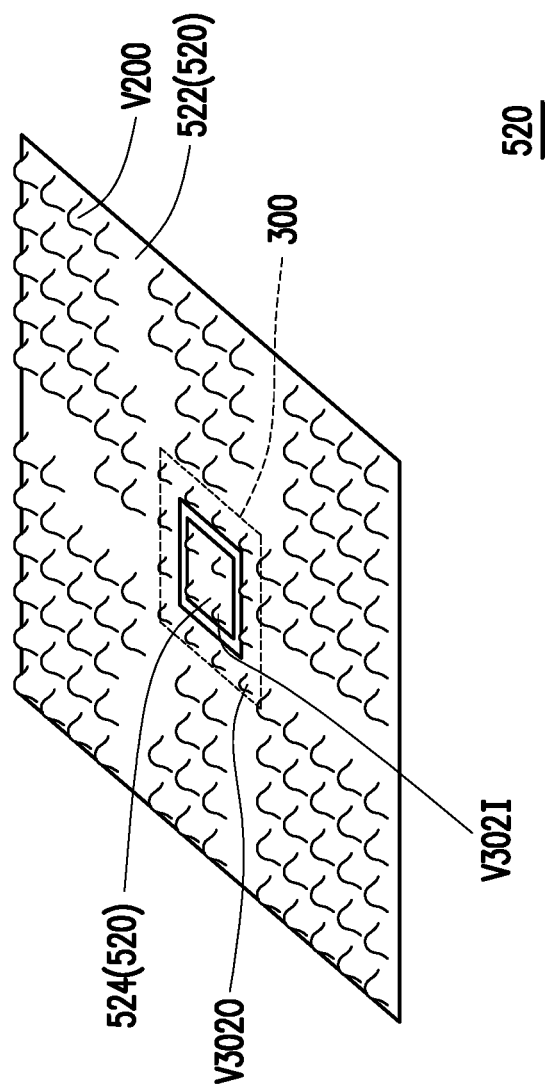
FIG. 2D is a schematic three-dimensional view of a first metallization layer of a redistribution structure in accordance with some embodiments of the disclosure.

FIG. 2A to FIG. 2C are schematic cross-sectional views of the semiconductor package 10 according to some embodiments of the disclosure. FIG. 2D is a schematic three-dimensional view of the first frontside metallization layer 520 in accordance with some embodiments of the disclosure. The cross-sectional views of FIG. 2A to FIG. 2C are taken in the XY plane at the level heights I-I, II-II and III-III indicated in FIG. 1G, respectively. As a reference, the cross-sectional views of FIG. 1A to FIG. 1G are taken in the plane XZ illustrated in FIG. 1G (in which Z is a thickness direction of the semiconductor package 10, normal to the active surface 300$t$ of the semiconductor die 300). The level height I-I (shown in FIG. 1G) at which the cross-sectional view of FIG. 2A is taken passes through the backside metallization layer 120 and the inner dielectric layer 130. For clarity are illustrated as dashed lines the footprints of the TIVs 200 and the semiconductor die 300. Referring to FIG. 2A, the backside metallization layer 120 may be substantially a metallic plate surrounded at the edges by the inner dielectric layer 130. The TIVs 200 may directly contact the backside metallization layer 120 at the positions indicated by the dashed lines. The level height II-II (shown in FIG. 1G) at which the cross-sectional view of FIG. 2B is taken passes through the encapsulant 400, the semiconductor die 300 and the TIVs 200. As illustrated in FIG. 2B, the TIVs 200 may be disposed in groups surrounding the semiconductor die 300. For example, in FIG. 2B there are six groups of TIVs, four of which are disposed at the corners of the semiconductor package 10 and two along the edges extending in the Y direction of the semiconductor package 10. In some embodiments, a TIV 200 may directly face multiple adjacent TIVs within the same group. For example, the TIV 201 directly faces three adjacent TIVs of the same group to which the TIV 201 belongs, the TIV 202 directly faces five adjacent TIVs, the TIV 203 directly faces six adjacent TIVs, the TIV 204 directly faces seven adjacent TIVs, and the TIV 205 directly faces eight adjacent TIVs. In some embodiments, there is at least one TIV 203 directly facing six adjacent TIVs belonging to the same group.

The groups of TIVs are separated by channels CH radially extending from the semiconductor die 300 towards the edges of the semiconductor package 10. As illustrated in FIG. 2B, the TIVs 200 belonging to a given group may have substantially the same shape and be regularly spaced along at least two directions. For example, taking as an example the two groups disposed at the top-right corner and the top-left corner of FIG. 2B, the TIVs 200 lying on the same side with respect to one of the channels CH (belonging to the same group) may be disposed with a regular pitch Px (a distance in the photonic crystal structure) along the X direction. The channel CH may extend along a direction different than the X direction, (the Y direction). A width W of the channel CH measured along the X direction may be greater than the pitch Px. In some embodiments, the width W is measured as the distance between a pair of TIVs 200 disposed on opposite side of the channel CH and aligned along the X direction. In some embodiments, the distance between the pair of TIVs 200 is taken as the length of the encapsulant 400 separating the two TIVs 200 of the pair. In some embodiments, for a given channel CH the width W is measured along a direction (e.g., the X direction) different than the extending direction (e.g., the Y direction). In some embodiments, by carefully disposing the TIVs 200 in the encapsulant 400, photonic crystal structures may be generated surrounding the semiconductor die 300. That is, the conductive material of the TIVs 200 may act as surrogate high-k dielectric material in a bidimensional photonic crystal structure, with the material of the encapsulant 400 acting as lower-k dielectric material. In some embodiments, the semiconductor die 300 may be a device operating with high-frequency signals. In such cases, the photonic crystal structure may provide protection or isolation from electromagnetic noise or interference. In some embodiments, the shape and the position of the TIVs 200 may be adapted to select a frequency range that is transmitted along the channels CH, while frequencies outside of the selected range are blocked by the photonic crystal structure. For example, refraction at the interface between the high-k material (the TIVs 200) and lower-k material (the encapsulant 400) may result in destructive interference of frequencies outside the range selected for transmission. In some embodiments, the metallization layer 120, the first metallization layer 520 and the photonic crystal structure defined by the TIVs 200 and the encapsulant 400 may act as the side surfaces of an antenna structure, and a signal in the selected frequency range (the frequency range of operation of the antenna) may be transmitted or received along the channels CH. In some embodiments, the semiconductor package 10 may operate as an end-fire antenna. In some embodiments, transmission and reception of high-frequency signals are confined to the channels CH, as opposed to spreading where the photonic crystal structure is formed. In some embodiments, low frequency signals (e.g., power signal) may be unaffected or only marginally affected by the presence of the photonic crystal structure.

The level height III-III (shown in FIG. 1G) at which the cross-sectional view of FIG. 2C is taken passes through the first frontside metallization layer 520 and the second frontside dielectric layer 530. For clarity the footprint of the semiconductor die 300 is illustrated as a dashed line. In some embodiments, referring to FIG. 1G, FIG. 2C and FIG. 2D, the first metallization layer 520 includes the peripheral pattern 522 and the die interconnect pattern 524. In some embodiments, the die peripheral pattern 522 surrounds the die interconnect pattern 524, and is separated from the die interconnect pattern 524 by a gap G filled by the second dielectric layer 530. In some embodiments, the gap G separates the inner edge of the peripheral pattern 522 from the outer edge of the die interconnection pattern 524. In FIG. 2C, the first metallization layer 520 is shown to include multiple regions V200, V302I, V302O filled by the second dielectric layer 530. These regions V200, V302I, V302O correspond to the points in which the first metallization layer 520 penetrates through the first dielectric layer 510 to establish electrical contact with the TIVs 200 and the contact pads 302I, 302O. As illustrated in FIG. 2D, the first metallization layer 520 includes via regions V200, V302I, V302O protruding towards the overlying TIVs 200 and the semiconductor die 300, to establish electrical connection with the overlying elements. It should be noted that while in FIG. 1G and in FIG. 2C the areas at the level height III-III where the via regions V200, V302I, V302O are located are filled by the second dielectric layer 530, the disclosure is not limited thereto. In some alternative embodiments, the areas at the level height III-III where the via regions V200, V302I, V302O are located are filled by the conductive material of the first metallization layer 520. That is, the protrusions shown in FIG. 2D and corresponding to the via regions V200, V302I and V302O may be solid conductive plugs integrally formed with the metallization layer 520. Whether the second dielectric layer 530 or the first metallization layer 520 is disposed in said areas may depend on the dimensions of the openings O2 of the first dielectric layer 510 (illustrated in FIG. 1E) and the fabrication method adopted for the first metallization layer 520. In some embodiments, some of the areas at the level height III-III corresponding to the via regions V200, V302I, V302O may be filled by the second dielectric layer 530 and the remaining areas may be filled by the first metallization layer 520. In some embodiments, the via regions V200 contacting the TIVs 200 and the via regions 302O contacting the outer contact pads 302O are formed in the peripheral pattern 524, while the via regions V302I contacting the inner contact pads 302I are formed in the die interconnection pattern 302I. In some embodiments, outer contact pads 302O are formed along the edge of the semiconductor die 300. Consequently, the via regions V302O are formed along the inner edge of the peripheral pattern 522. That is, the peripheral pattern 522 may (partially) extend over the semiconductor die 300.

Figure 3A:
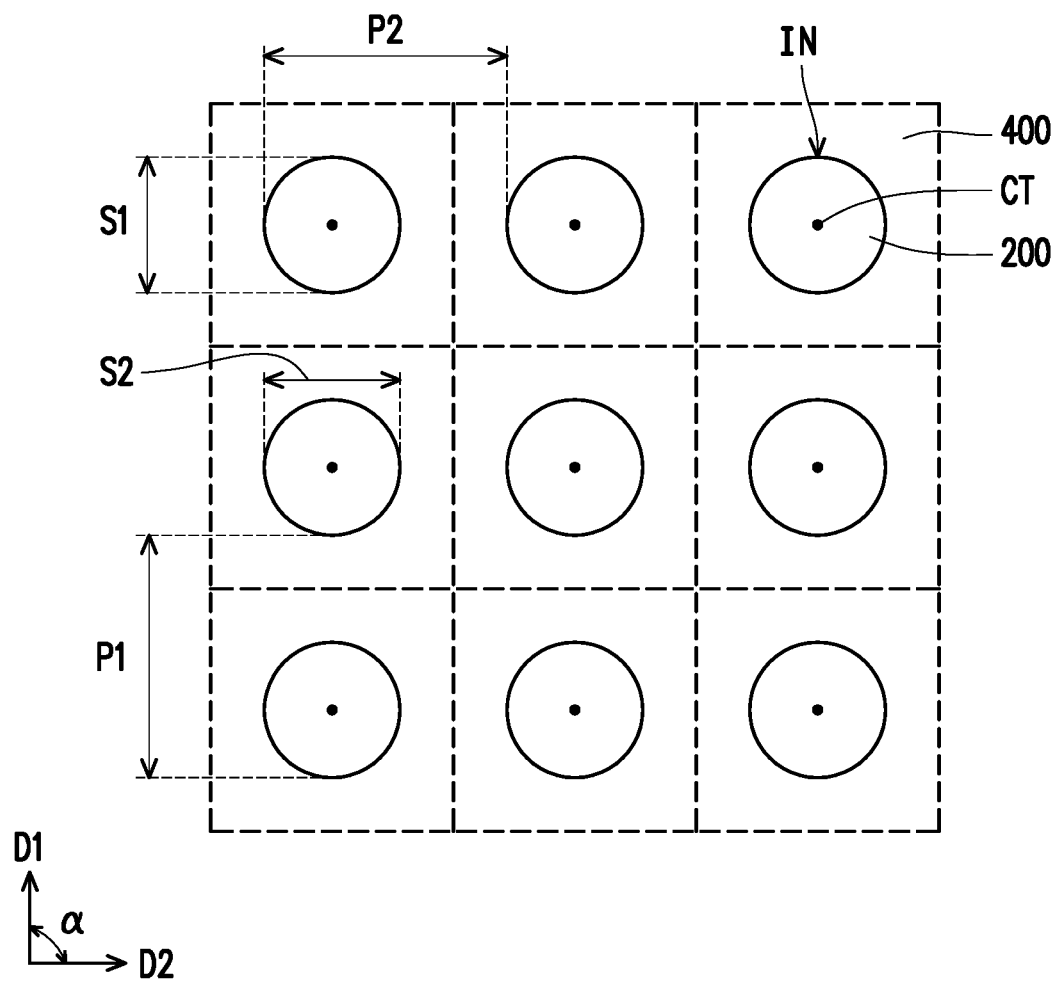
FIG. 3A and FIG. 3B are schematic cross-sectional views of a portion of a semiconductor package according to some embodiments of the disclosure.
Figure 3B:
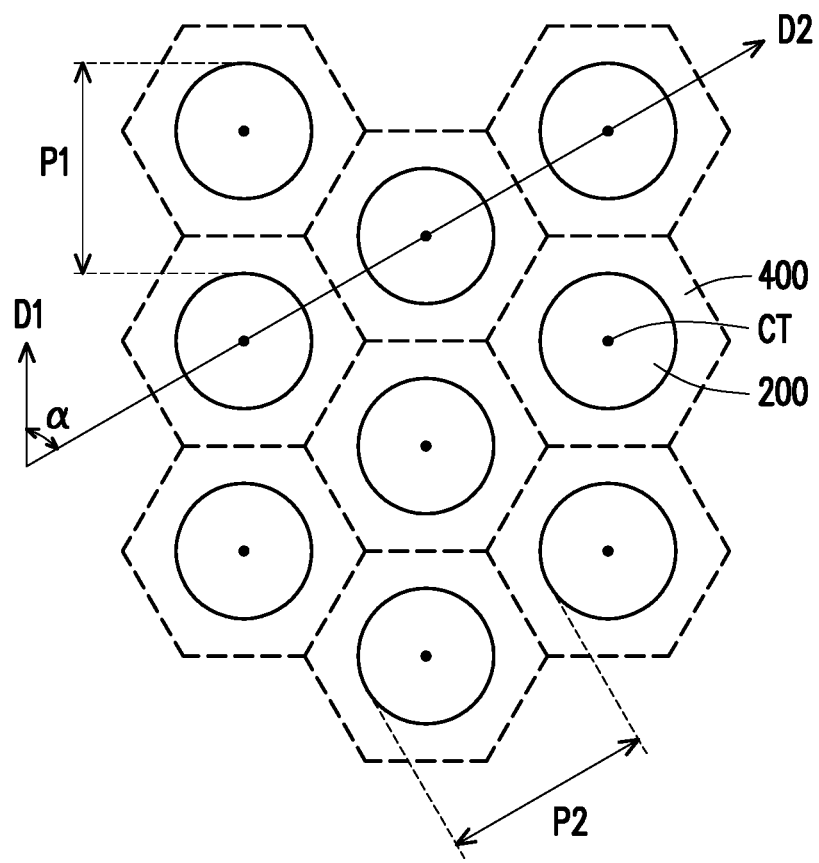

FIG. 3A and FIG. 3B show enlarged cross-sectional views in the XY plane of the area A of FIG. 2B according to some embodiments of the disclosure. In FIG. 3A and in FIG. 3B adjacent TIVs 200 are shown. Referring to FIG. 3A, in some embodiments, the cross-section of a TIV 200 in the XY plane may be characterized by a first size S1 and a second size S2 taken in a direction perpendicular to the first size S1. In some embodiments, the first size S1 may be equal to the second size S2, and the TIV 200 may have a circular, square or rhombic profile. In some alternative embodiments, the first size S1 may be different from the second size S2, and the profile of the TIV 200 may be elliptical, rectangular or parallelogramical. In some embodiments, a center CT of the cross-section of a TIV 200 is defined as the point minimizing the sum of the squared distances between the point itself and the outline (geometric center) of the corresponding cross section. In some embodiments, the outline of the cross-section may be taken as the interface IN between the TIV 200 and the encapsulant 400. As a non-limiting example, the TIVs 200 of FIG. 3A have a cylindrical shape, the outline of the respective cross-sections may be close to a circumference, and the center of each circumference may correspond to the center CT of the cross-sections of FIG. 3A. That is, the first size S1 may be the same as the second size S2, and coincide with the diameter of the circumference. In some embodiments, the diameter S1, S2 of the cross-section of the TIVs 200 may be in the range from 100 to 300 micrometers. In some embodiments, the diameter S1, S2 may measure 150 micrometers. In some embodiments, the TIVs 200 may be disposed with regular pitches P1 and P2 along a first direction D1 and a second direction D2. In some embodiments, the pitch P1 or the pitch P2 may be measured as the distance between corresponding points of the interfaces IN of adjacent TIVs 200 aligned along the first direction D1 or the second direction D2, respectively. In some embodiments, the pitch P1 and the pitch P2 may independently be in the range from 300 to 500 micrometers. In some embodiments, the pitch P1 along the first direction D1 may be the same as the pitch P2 along the second direction D2. In some embodiments, the pitch P1 may be equal to the pitch P2, and may measure 400 micrometers. In some embodiments, an angle α is formed by the first direction D1 and the second direction D2. For example, in FIG. 3A the angle α is π/2 radians, and the first direction D1 is perpendicular with respect to the second direction D2. In some embodiments, the disposition of the TIVs 200 may be schematized according to regular units. For example, referring to FIG. 3A, a TIV 200 may be considered as the center of a square unit (illustrated with dashed edges), where each square unit shares at least one edge with another adjacent square unit.

Each unit has one TIV 200 at its center. The shared edge of a pair of units may be construed as the ensemble of points equidistant from the centers CT of the two corresponding TIVs 200. In some embodiments, the centers CT are aligned along the first direction D1 and the second direction D2. In some alternative embodiments, the TIVs may be disposed according to units of different shapes. For example, as illustrated in FIG. 3B, the unit may be hexagonal. In the case of FIG. 3B, the angle α between the first direction D1 and the second direction D2 is $\pi/3$ radians.

In some embodiments, using the TIVs 200 as surrogate high-k dielectric material to form a photonic crystal structure with the encapsulant 400 may improve thermal dissipation of the heat generated by high-frequency operation of the semiconductor package 10. In some embodiments, an improvement of about 23% in the thermal resistance of the semiconductor package 10 may be achieved, and the temperature reached by the semiconductor die 300 during operation may be lowered. In some embodiments, a heat flow towards the connectors 700 disposed along the edges of the semiconductor package 10 may increase of about 78%. That is, the overall thermal performance of the semiconductor package 10 may be enhanced. In some embodiments, inclusion of the photonic crystal structure may effectively reduce the crosstalk noise experienced by the semiconductor package 10 of about 55%, and the shielding effectiveness may be increased of about 24%.

Figure 4:
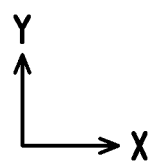
FIG. 4 is a schematic cross-sectional view of a semiconductor package according to some embodiments of the disclosure.
Figure 4:
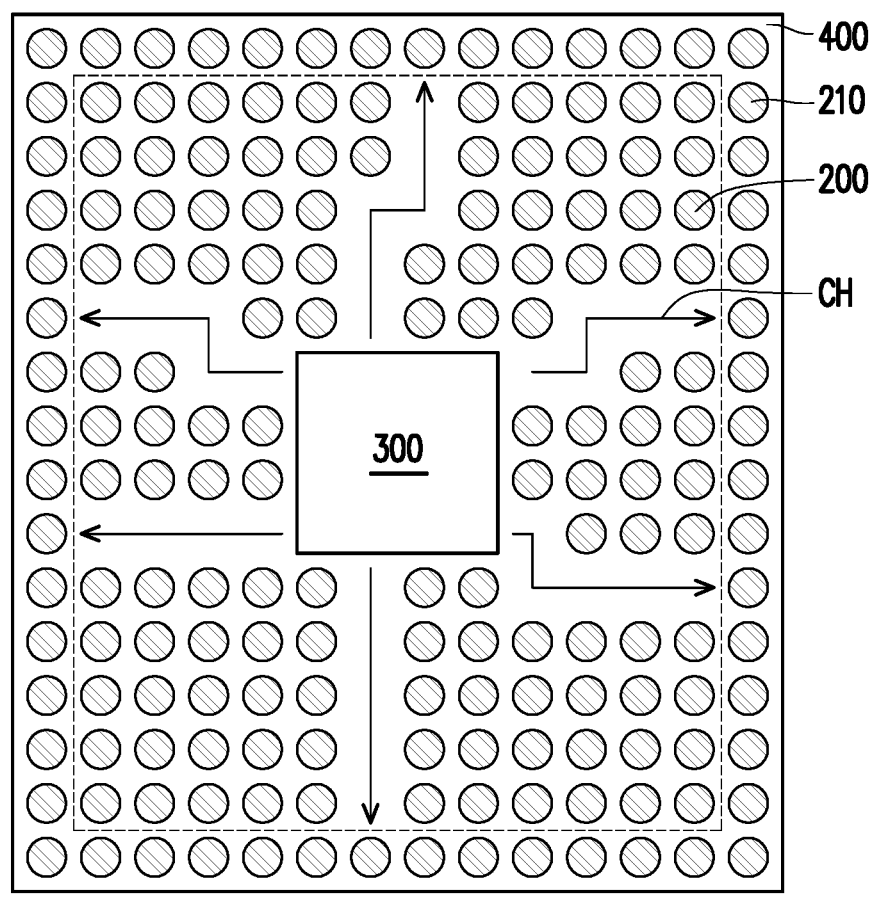

FIG. 4 shows a schematic cross-sectional view of a semiconductor package 20 according to some embodiments of the disclosure. The cross-sectional view of FIG. 4 is taken at the level height II-II shown in FIG. 1G. The semiconductor package 20 of FIG. 4 may be similar to the semiconductor package 10 of FIG. 2B, and the same or similar reference numerals are used to indicate corresponding parts. A difference between the semiconductor package 20 of FIG. 4 and the semiconductor package 10 of FIG. 2B lies in an additional ring of TIVs 210 disposed along the edge of the semiconductor package 20. That is, the groups of TIVs 200 formed in the semiconductor package 20 are connected by the additional ring of TIVs 210 along the edges of the semiconductor package 20. As such, one TIV 210 is disposed at the end of the channels CH further away from the semiconductor die 300. The additional ring of TIVs 210 may further reduce the electromagnetic interference and the crosstalk for the transmission channels CH of the semiconductor package 20. In some embodiments, the additional ring of TIVs 210 may couple a signal transmitted by the semiconductor die 300 with resonating elements formed in the metallization layer 120, and the semiconductor package 20 may operate as a broadside antenna. That is, the signal may transmit along the channels CH of the photonic crystal structures formed by the TIVs 200, and then be coupled through the outer TIVs 210 to other antenna elements connected to the outer TIVs 210.

Figure 5A:
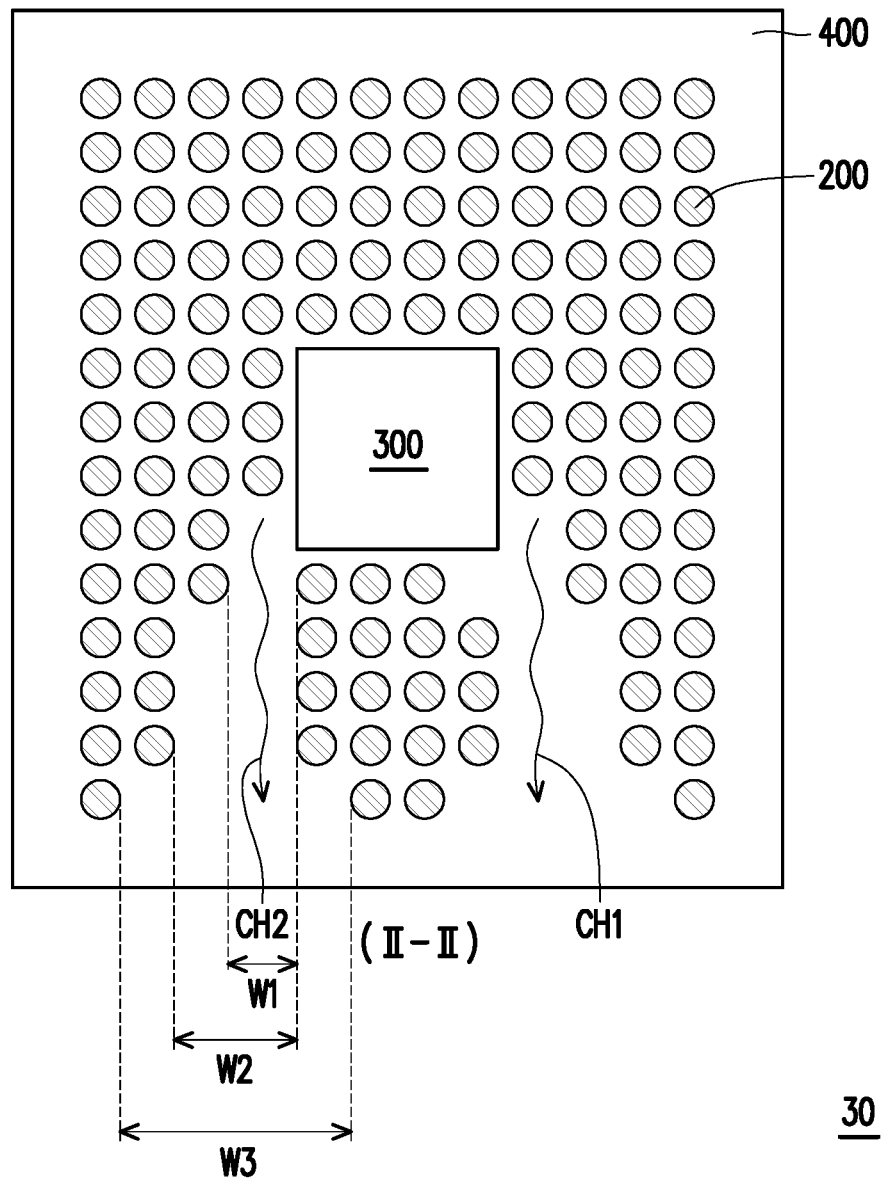
FIG. 5A and FIG. 5B are schematic cross-sectional views of a semiconductor package according to some embodiments of the disclosure.
Figure 5B:
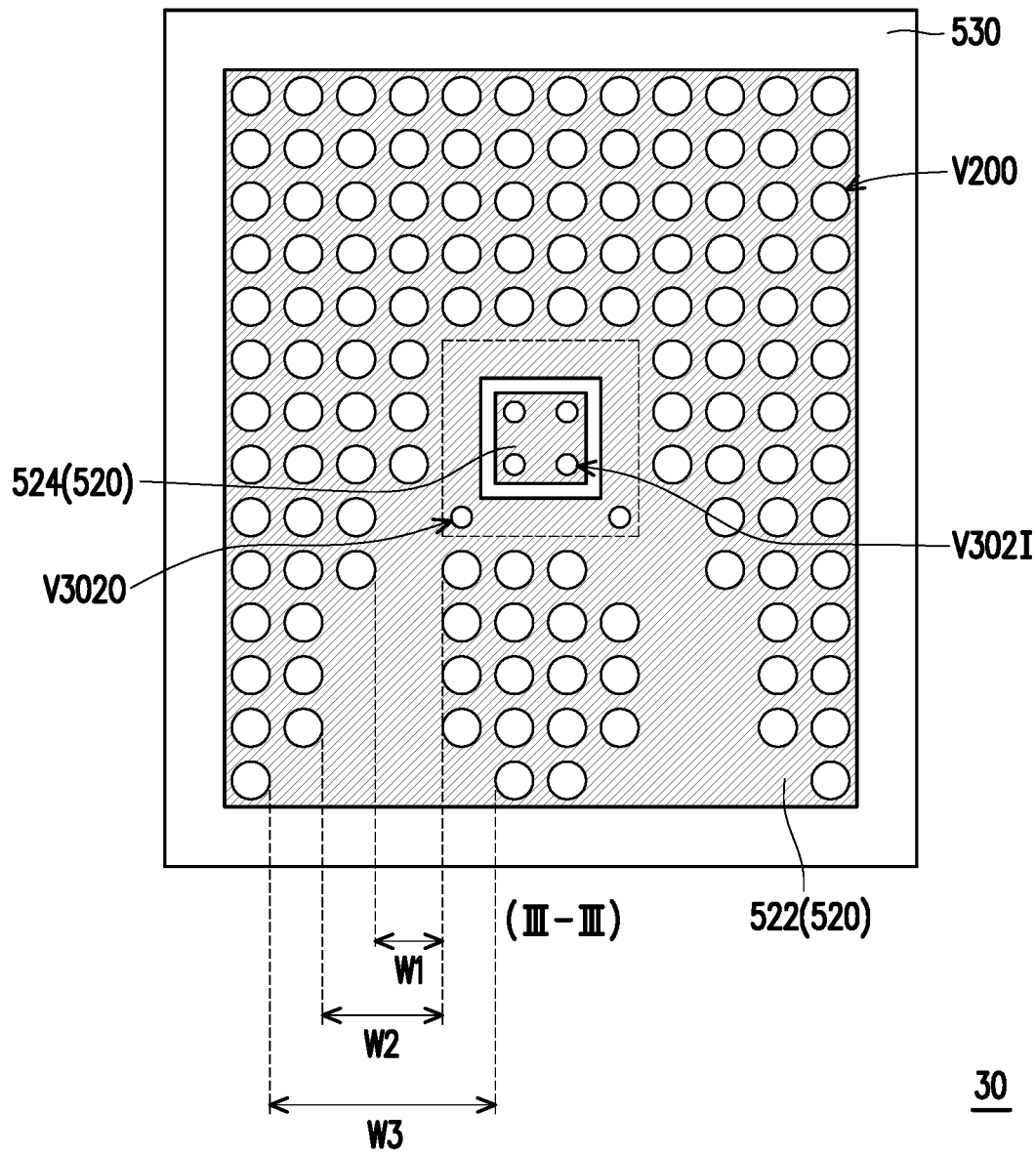

FIG. 5A and FIG. 5B show schematic cross-sectional views of a semiconductor package 30 according to some embodiments of the disclosure. The cross-sectional view of FIG. 5A is taken at the level height II-II shown in FIG. 1G, and the cross-sectional view of FIG. 5B is taken at the level height III-III shown in FIG. 1G. The semiconductor package 30 of FIG. 5A and FIG. 5B may be similar to the semiconductor package 10 described above, and the same or similar reference numerals are used to indicate corresponding parts. In the semiconductor package 30, the TIVs 200 are disposed to form channels CH1 and CH2 of a horn antenna (end-fire antenna). That is, the TIVs 200 may surround the semiconductor die 300 on three sides, and form transmission channels CH1 and CH2 on the fourth side. Each one of the channels CH1 and CH2 may include multiple sections of increasing width W1, W2, W3 proceeding further away from the semiconductor die 300. For example, as illustrated for the channel CH2 in FIG. 5A, the channel CH2 may include a first section of width W1 closer to the semiconductor die 300, an intermediate section of width W2 after the first section, and a final section of width W3 further away from the semiconductor die 300, where the width of the sections may increase in the order W1<W2<W3. In some embodiments, the width W3 is adjusted based on the operational frequency of the semiconductor die 300 (and the semiconductor package 30). That is, the width W3 may be adapted according to the frequency (or frequencies) to be received or transmitted. For example, the width W3 may be selected to be about half of the wavelength value corresponding to the operational frequency (i.e., the value obtained by converting the operational frequency into wavelength). In some embodiments, the width W1, W2 or W3 may be considered as the distance separating a pair of TIVs 200, where each TIV 200 of the pair is disposed on one side of the channel CH1 or CH2. In some embodiments, if the channel CH1 or CH2 extends along a first direction (e.g., the direction Y in FIG. 5B), the width W1, W2 or W3 are measured along a second direction (e.g., the direction X in FIG. 5B) perpendicular to the first direction. In some embodiments, referring to FIG. 5B, the peripheral pattern 524 may include at least one via V302O contacting a contact pad 302O (illustrated in FIG. 1G) of the semiconductor die 300 in correspondence of each one of the channels CH1 and CH2. While two channels CH1 and CH2 are illustrated in FIG. 5A and FIG. 5B as an exemplary embodiment, the disclosure is not limited by the number of sections nor the number of channels forming the horn antenna of the semiconductor package 30. In some embodiments, more or fewer channels constituted by more or fewer sections than the ones illustrated in FIG. 5A and FIG. 5B may be included.

Figure 6A:
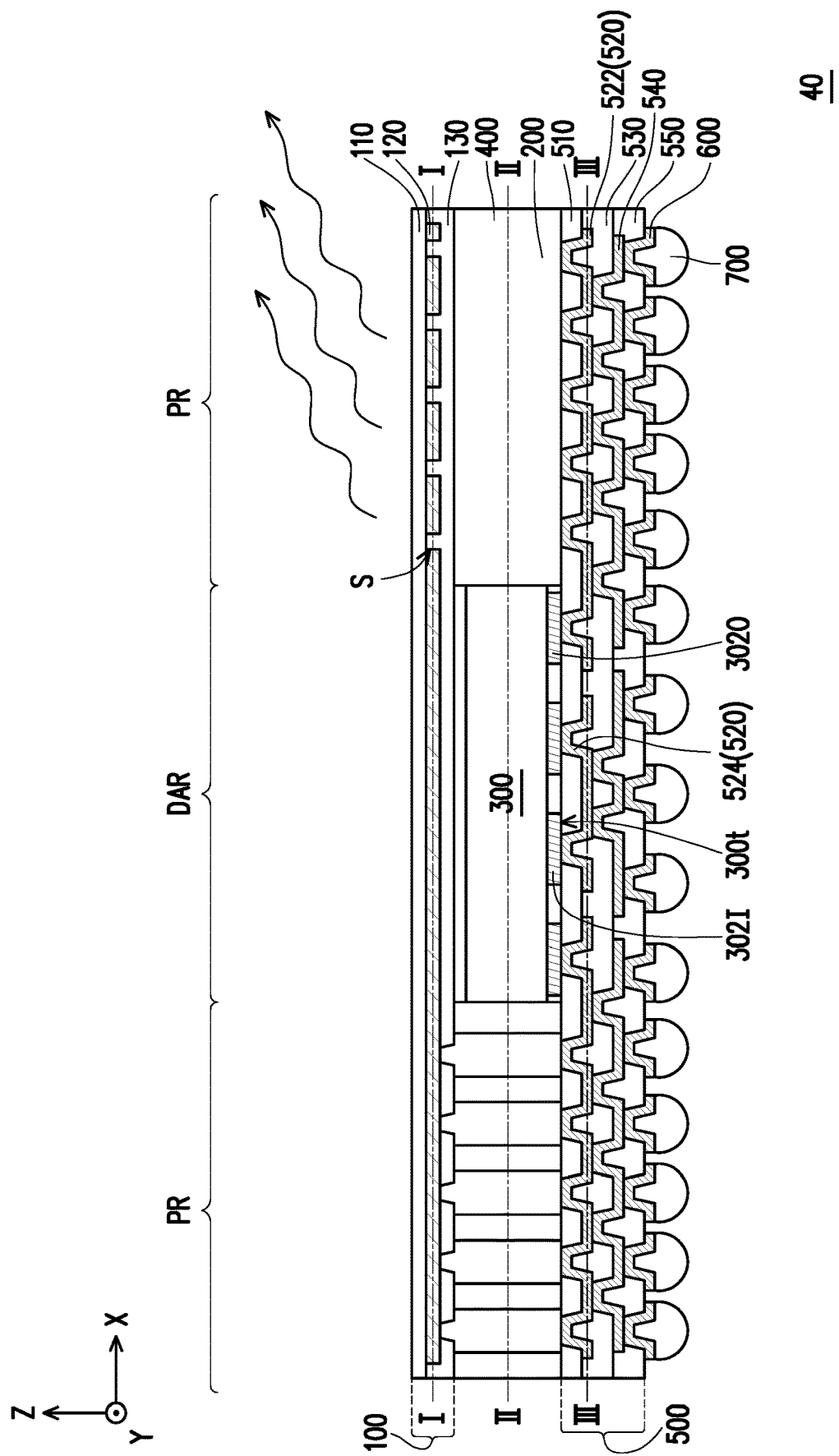
FIG. 6A to FIG. 6D are schematic cross-sectional views of a semiconductor package according to some embodiments of the disclosure.
Figure 6B:
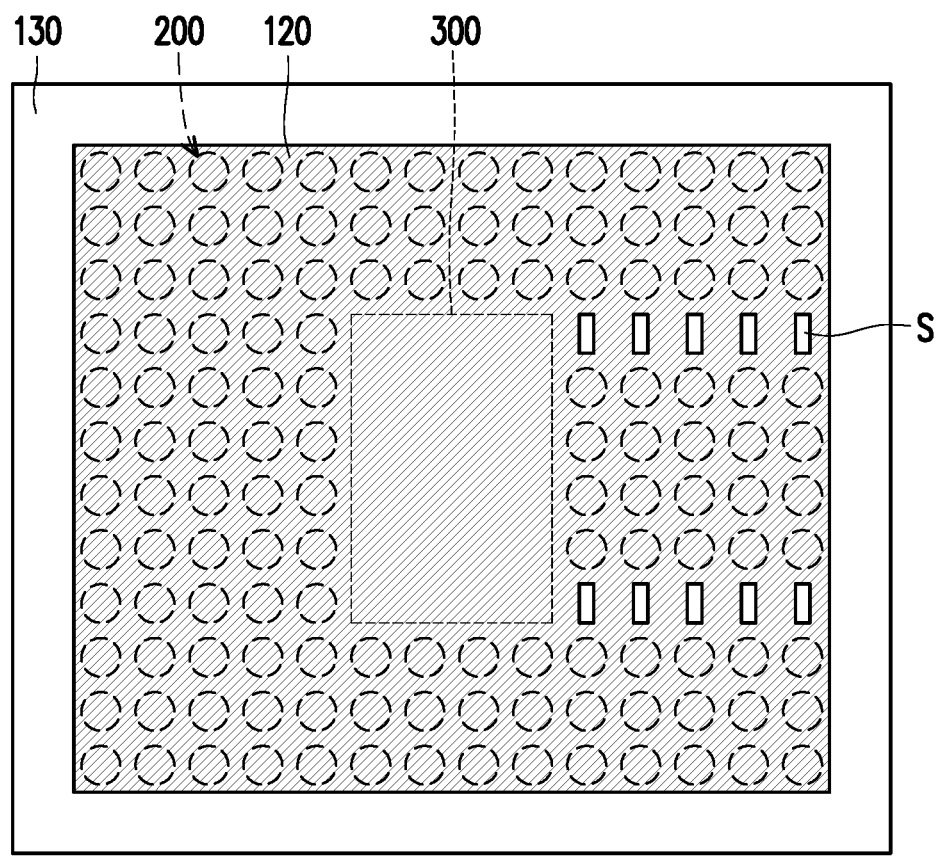
Figure 6C:
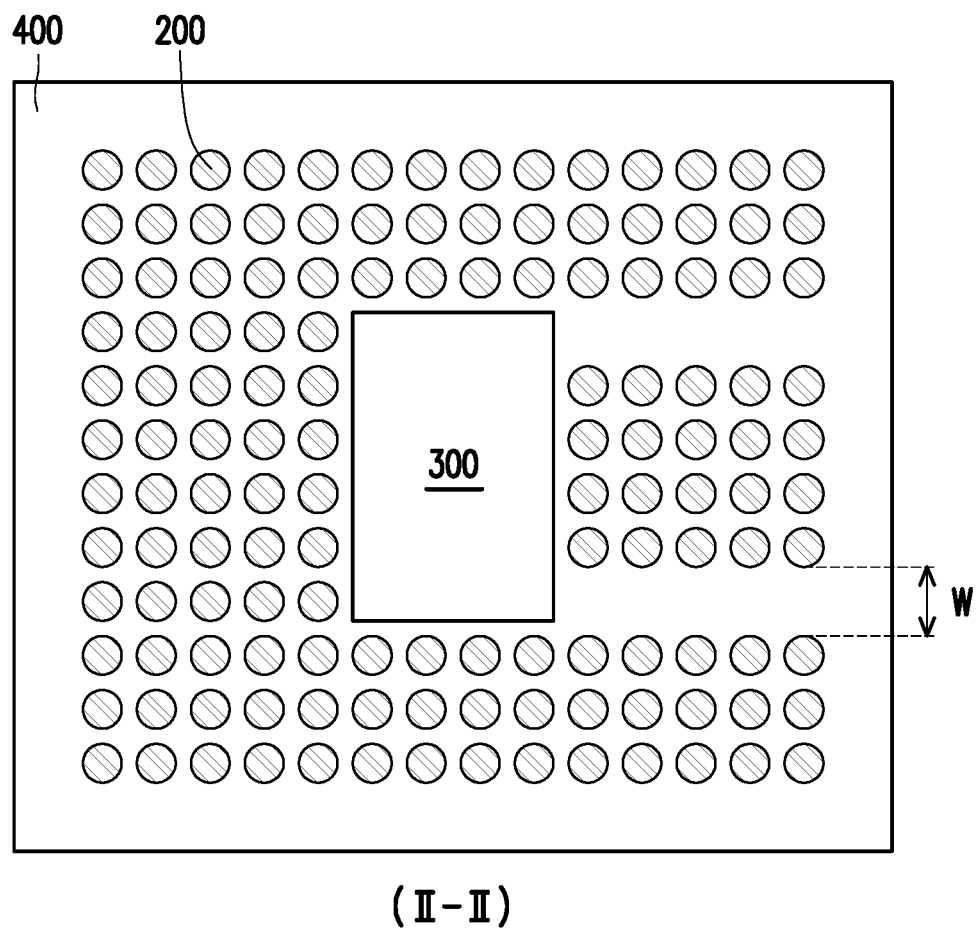
Figure 6D:
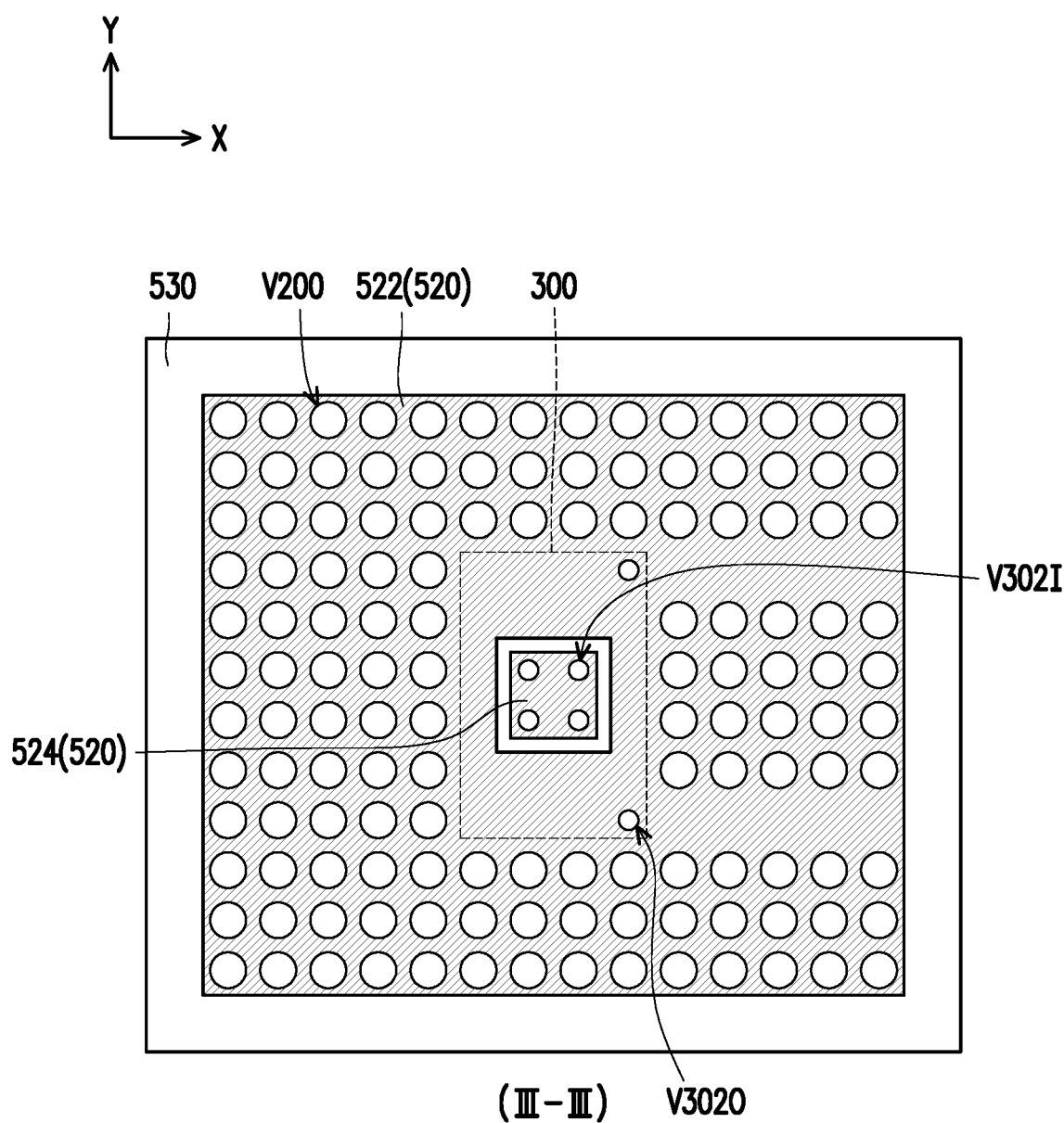

FIG. 6A to FIG. 6D show cross-sectional views of a semiconductor package 40 according to some embodiments of the disclosure. The cross-sectional view of FIG. 6A is taken in the XZ plane (as the cross-sectional views of FIG. 1A to FIG. 1H). The cross-sectional views of FIG. 6B to FIG. 6D are taken in the XY plane, at level heights I-I, II-II and III-III (indicated in FIG. 6A), respectively. The semiconductor package 40 of FIG. 6A to FIG. 6D may be similar to the semiconductor package 10 described above, and the same or similar reference numerals are used to indicate corresponding parts. In the semiconductor package 40, the TIVs 20 are disposed to form two straight channels of width W on one side of the semiconductor die 300. In some embodiments, the width W of the channels may be in the range from 0.25 to 0.45 times the wavelength value of the operational frequency of the semiconductor package 40. The backside metallization layer 120 may be patterned to include slots S in correspondence of the channels defined by the TIVs. The slots S may be aligned over the channels defined by the TIVs 200. If the channels extend in the X direction as illustrated in FIG. 6B, the slots S overlying one channel may be aligned in the X direction and be elongated in the Y direction. In some embodiments, vertical projections of the slots S in the XY plane at the level height II-II of FIG. 6A fall on the encapsulant 400. That is, the TIVs 200 are not disposed underneath the slots S. The inclusion of the slots S may allow the semiconductor package 40 to function as a leaky-wave antenna. That is, the presence of the slots S may allow high-frequency signals to be propagated in a direction skewed with respect to the XY plane, as illustrated in FIG.

6A. In some embodiments, the first metallization layer 520 may include at least one via V302O contacting an outer contact pad 302O (shown in FIG. 6A) of the semiconductor die 300 at one end of each channel. While in FIG. 6A to FIG. 6D only two channels are illustrated, the disclosure is not limited thereto. In some alternative embodiments, fewer or more channels may be formed.

In accordance with some embodiments of the disclosure, a semiconductor package includes a die, through insulator vias, an encapsulant, and a pair of metallization layers. The through insulator vias are disposed beside the die. The encapsulant wraps the die and the through insulator vias. The pair of metallization layers is disposed on opposite sides of the encapsulant. One end of each through insulator via contacts one of the metallization layers and the other end of each through insulator via contacts the other metallization layer. The through insulator vias form at least one photonic crystal structure. A pair of the through insulator vias is separated along a first direction by a channel filled by the encapsulant. A width of the channel along the first direction is larger than a pitch of the photonic crystal structure along the first direction.

In accordance with some embodiments of the disclosure, a semiconductor package includes a backside interconnection structure, a die, an encapsulant, a redistribution structure, and through insulator vias. The backside interconnection structure includes a metal plate. The die is disposed on the backside interconnection structure. The encapsulant is disposed on the backside interconnection structure and surrounds the die. The redistribution structure extends over the die and the encapsulant and includes a first metallization layer. The through insulator vias extend across the encapsulant from the metal plate to the redistribution structure, are disposed along two directions with a fixed pitch along each direction, and form at least three rows for each direction. A portion of encapsulant separates at least one pair of through insulator vias along a first direction of the two direction, and the pitch along the first direction measures less than the portion of encapsulant along the first direction.

In accordance with some embodiments of the disclosure, a manufacturing method of a semiconductor package includes at least the following steps. A metal plate is formed. The metal plate has a first dielectric layer thereon. The first dielectric layer includes openings exposing portions of the metal plate. Through insulator vias are provided in each opening of the first dielectric layer. A die is disposed on the first dielectric layer. The die and the through insulator vias are encapsulated in an encapsulant. A redistribution structure is formed on the encapsulant, the die and the through insulator vias. The openings of the first dielectric layer are aligned to form a bi-dimensional photonic crystal pattern crossed through by at least one channel without openings radially extending away from the die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
a die;
through insulator vias, disposed beside the die;
an encapsulant, wrapping the die and the through insulator vias; and
a pair of metallization layers disposed on opposite sides of the encapsulant,
wherein one end of each through insulator via contacts one of the metallization layers, the other end of each through insulator via contacts the other metallization layer, the through insulator vias form at least one photonic crystal structure, a pair of the through insulator vias is separated along a first direction by a channel filled by the encapsulant, and a width of the channel along the first direction is larger than a distance along the first direction between through insulator vias in the at least one photonic crystal structure,
wherein shapes and positions of the through insulator vias are adapted to transmit signals of a first frequency range along the channel, while signals of frequencies outside of the first frequency range are blocked by the photonic crystal structure,
wherein one of the metallization layers is an integral structure extending over the encapsulant, the die, and the through insulator vias and extending parallel to a backside surface of the die.

2. The semiconductor package of claim 1, wherein at least one through insulator via directly faces six through insulator vias.

3. The semiconductor package of claim 1, wherein the channel of encapsulant is radially oriented from the die toward an edge of the semiconductor package.

4. The semiconductor package of claim 3, wherein the die has a contact pad directly connected to one of the metallization layers in correspondence of one end of the channel.

5. The semiconductor package of claim 3, wherein a portion of the through insulator vias are disposed along the edge of the semiconductor package, and one through insulator via of the portions of through insulator vias is disposed at one end of the channel.

6. The semiconductor package of claim 1, wherein a second pair of through insulator vias is separated along the first direction by a second channel filled by the encapsulant, and a width of the second channel along the first direction is larger than the distance along the first direction between through insulator vias in the at least one photonic crystal structure.

7. The semiconductor package of claim 1, wherein a width of the channel increases with increasing distance from the die.

8. The semiconductor package of claim 1, wherein the one end of each through insulator via contacts a same first metal plate of one of the metallization layers, the other end of each through insulator via contacts a same second metal plate of the other metallization layer,
the first metal plate and the second metal plate extend parallel to each other, overlapping the die, the through insulator vias, and the encapsulant, and
the first metal plate further contacts at least one contact pad of the die.

9. A semiconductor package, comprising:
a backside interconnection structure including a metal plate;
a die disposed on the backside interconnection structure;
an encapsulant, disposed on the backside interconnection structure and surrounding the die;

a redistribution structure extending over the die and the encapsulant and including a first metallization layer, wherein the first metallization layer includes a peripheral pattern; and through insulator vias, wherein the through insulator vias extend across the encapsulant from the metal plate to the peripheral pattern, are disposed along two directions with a fixed pitch along each direction, and form at least three rows for each direction, and a portion of encapsulant separates at least one pair of through insulator vias along a first direction of the two direction, and the pitch along the first direction measures less than the portion of encapsulant along the first direction, wherein the metal plate is an integral structure extending for a span of the semiconductor package, under the encapsulant, the die, and the through insulator vias, and wherein the peripheral pattern is an integral structure oriented toward the same direction with the metal plate, and over the through insulator vias, edges of the die, and the encapsulant.

10. The semiconductor package of claim 9, wherein an angle between the alignment directions of the through insulator vias is $\pi/3$.

11. The semiconductor package of claim 9, wherein the first metallization layer has a die interconnection pattern contacting the die and the peripheral pattern contacting the die and the through insulator vias.

12. The semiconductor package of claim 11, wherein the peripheral pattern is an annular conductive plate surrounding on all sides the die interconnection pattern, and a gap separates the peripheral pattern from the die interconnection pattern.

13. The semiconductor package of claim 9, wherein a region of the metal plate underlying the encapsulant includes slots aligned along a first dimension and elongating along a second dimension perpendicular to the first dimension.

14. The semiconductor package of claim 9, wherein the through insulator vias are disposed with a same pitch along the two directions to form at least one photonic crystal structure.

15. The semiconductor package of claim 9, wherein the through insulator vias are separated by a channel filled by the encapsulant and extending away from the die, and a distance between a first pair of through insulator vias disposed on opposite sides of the channel is smaller than a distance between a second pair of through insulator vias disposed on opposite sides of the channel, wherein the second pair is further away from the die than the first pair, and no other through insulator via is disposed between the through insulator vias of the first pair and between the through insulator vias of the second pair.

16. A semiconductor package, comprising:
a backside interconnection structure;
a die disposed on the backside interconnection structure;
an encapsulant, disposed on the backside interconnection structure and surrounding the die;
a redistribution structure extending over the die and the encapsulant; and through insulator vias, wherein the through insulator vias extend across the encapsulant from the backside interconnection structure to the redistribution structure, are disposed along two intersecting directions with a fixed pitch along each direction, wherein through insulator vias of a first pair of the through insulator vias are separated from each other along a first direction of the two directions by a channel of encapsulant and directly face each other across the channel, the channel extends away from the die perpendicularly to the first direction in correspondence of the one side, through insulator vias of a second pair of the through insulator vias are separated from each other along the first direction by the channel and directly face each other across the channel, the first pair of through insulator vias is disposed at a first end of channel closer to the die, the second pair of through insulator vias is disposed at an opposite end of the channel further away from the die, and a first distance measured along the first direction between the through insulator vias of the first pair across the channel is smaller than a second distance measured along the first direction across the channel between the through insulator vias of the second pair.

17. The semiconductor package of claim 16,
wherein through insulator vias of a third pair of the through insulator vias are separated from each other along the first direction by the channel and directly face each other across the channel, the third pair is disposed closer to the die than the second pair and further from the die than the first pair, and a third distance measured along the first direction between the through insulator vias of the second pair across the channel is larger than the first distance and smaller than the second distance.

18. The semiconductor package of claim 16, wherein the semiconductor package is configured as a horn-fire antenna adapted to transmit and/or receive signals, wherein the signals have an operational frequency, and the second distance corresponds to half of a wavelength value obtained by converting the operational frequency to wavelength.

19. The semiconductor package of claim 16, wherein through insulator vias of a third pair of the through insulator vias are separated from each other along the first direction by another channel of encapsulant and directly face each other across the other channel, and the other channel extends away from the die parallel to the channel.

20. The semiconductor package of claim 16, wherein the first distance is greater than the fixed pitch along the first direction.

* * * * *